(12) United States Patent
Knudsen

(10) Patent No.: US 6,380,874 B1
(45) Date of Patent: Apr. 30, 2002

(54) SYSTEM AND METHOD FOR SELF-CALIBRATING A MULTI-BIT DELTA-SIGMA ANALOG TO DIGITAL CONVERTER USING DYNAMIC ELEMENT MATCHING

(75) Inventor: Niels Knudsen, Humlebaek (DK)

(73) Assignee: National Instruments Corporation, Austin, TX (US)

( * ) Notice: Subject to any disclaimer, the term of this patent is extended or adjusted under 35 U.S.C. 154(b) by 0 days.

(21) Appl. No.: 09/710,663

(22) Filed: Nov. 8, 2000

Related U.S. Application Data

(63) Continuation-in-part of application No. 09/351,759, filed on Jul. 12, 1999, now Pat. No. 6,232,897.

(51) Int. Cl.⁷ ............................. H03M 1/06; H03M 1/10
(52) U.S. Cl. ...................................... 341/118; 341/120
(58) Field of Search ................................. 341/118, 120, 341/143, 108, 154; 323/315, 316

(56) References Cited

U.S. PATENT DOCUMENTS

| | | | | |
|---|---|---|---|---|
| 4,996,530 A | * | 2/1991 | Hilton | 341/120 |
| 5,101,205 A | | 3/1992 | Yasuda | |
| 5,406,283 A | * | 4/1995 | Leung | 341/143 |
| 5,726,652 A | * | 3/1998 | Giuroiu | 341/154 |
| 5,781,137 A | | 7/1998 | Knudsen | |
| 5,781,138 A | | 7/1998 | Knudsen | |
| 6,016,112 A | | 1/2000 | Knudsen | |
| 6,049,298 A | | 4/2000 | Knudsen | |

OTHER PUBLICATIONS

IEEE Press, Delta-Sigma ADCs with Multibit Internal Converters, Richard L. Carley et al., 1997, Chapter 8, pp. 244–281.

Candy, James C. and Temes, Gabor C., *Oversampling Delta–Sigma Data Converters*, 1992, pp. 227–228.

Candy, James C. and Temes, Gabor C., *Oversampling Delta–Sigma Data Converters*, 1992, pp. 192–195.

* cited by examiner

*Primary Examiner*—Patrick Wamsley
(74) *Attorney, Agent, or Firm*—Conley, Rose & Tayon, PC; Jeffrey C. Hood

(57) ABSTRACT

A system and method for calibrating an analog to digital (A/D) converter. The A/D converter includes an internal D/A converter, wherein the internal D/A converter includes a plurality of current generators, and wherein one or more of the current generators may produce linearity errors in the A/D converter. The A/D converter includes a switching element connected to the internal D/A converter. During calibration, the switching element operates to adjust connections to the current generators in the internal D/A converter one or more times according to different switching patterns, thereby causing different ones of the current generators to be stimulated by an input to the A/D converter. This avoids the necessity of using a complex and costly waveform generator input during calibration, which would normally be required to ensure that all of the current generators in the internal D/A converter are stimulated. Rather, a much simpler input can be used in calibrating the A/D converter, thereby reducing cost. A plurality of output digital signals from the A/D converter are recorded during calibration, wherein these recorded signals contain linearity error information associated with the respective current generators. This linearity error information may be extracted and used in calibrating the A/D converter.

22 Claims, 13 Drawing Sheets

SYSTEM AND METHOD FOR SELF-CALIBRATING A MULTI-BIT DELTA-SIGMA ANALOG TO DIGITAL CONVERTER USING DYNAMIC ELEMENT MATCHING

CONTINUATION DATA

This is a continuation-in-part of U.S. patent application Ser. No. 09/351,759 filing date Jul. 12, 1999, now U.S. Pat. No. 6,232,897, titled "System and Method for Calibrating an Analog to Digital Converter Through Stimulation of Current Generators" and filed on Jul. 12, 1999, whose inventor was Niels Knudsen.

FIELD OF THE INVENTION

This invention relates to the art of analog-to-digital (A/D) converters, and more particularly, to A/D converters which include linearity errors.

DESCRIPTION OF THE RELATED ART

Analog-to-digital converters (ADCs) are circuits used to convert signals from the analog domain, where the signals are represented by continuous quantities such as voltage and current, to the digital domain, where the signals are represented by numbers. These circuits can be implemented in a large number of ways. Established A/D conversion techniques include flash, delta-sigma (or sigma-delta), subranging, successive approximation, and integrating.

One example of an A/D converter is an over-sampled A/D converter. Oversampled A/D converters, often denoted as "delta-sigma converters" or "sigma-delta converters" are well known in the art. Delta-sigma (D/S) converters have gained in popularity due primarily to their ability to realize high resolution analog-to-digital conversion in mixed signal VLSI processors.

A D/S converter essentially digitizes an analog signal at a very high sampling rate (oversampling) in order to perform a noise shaping function. Digital filtering after the noise shaping allows the D/S converter to achieve a high resolution when compared with conventional A/D converters. Decimation is thereafter used to reduce the effective sampling rate back to the "Nyquist" rate. To gain an understanding of D/S converters, it is important to understand the operation of oversampling, noise shaping, digital filtering and decimation, the key concepts involved.

FIG. 1 shows, in block diagram form, a single bit D/S converter 10 commonly known in the art. The single bit D/S converter 10 includes a single bit D/S modulator 12 connected to a digital filter and decimation circuit 14. The D/S modulator 12 includes a summing node 16, a filter 18, a single bit A/D converter 20, and a single bit D/A converter 22. The D/A converter 22 is connected to the output of the A/D converter 20 and operates to provide feedback to the summing node 16. The summing node 16 includes a pair of inputs, one being connected to the analog input signal $V_{in}$ and the other being connected to the output of the D/A converter 22.

In operation, the output of summing node 16 is low-pass filtered by filter 18 and subsequently converted into a single bit, digital signal by A/D converter 20. The single bit digital signal in turn is converted back into an analog signal by D/A converter 22 and subtracted from analog input signal $V_{in}$ at summing node 16.

The single bit D/S modulator 12 converts the input signal $V_{in}$ into a continuous serial stream of 1s and 0s at a rate determined by sampling clock frequency, $kf_S$. Due to the feedback provided by the D/A converter 22 the average value output by the D/A converter 22 approaches that of the input signal $V_{in}$ if the loop has enough gain.

FIG. 2A shows a schematic implementation of the single bit D/S converter of FIG. 1. In particular, FIG. 2A shows a single bit D/S converter 30 which includes a single bit D/S modulator 32 connected to a digital filter and decimation circuit 34. The single bit D/S modulator 32 includes a summing node 36, an integrator 38, a latched comparator 40 which functions as the single bit A/D converter, and a simple switching mode device 42 which functions as the single bit D/A converter.

Integrator 38 acts as a filter and has an amplitude response in the frequency domain proportional to 1/f, where f is the input frequency. Since the chopper like action of the clocked, latched comparator 40 converts the input signal to a high frequency AC signal, varying about the average value of the input $V_{in}$, the effective quantization noise at low frequencies is greatly reduced. In effect, low frequency quantization noise is "shaped" into higher frequencies. FIG. 2B shows the simulated noise density as a function of frequency of a D/S modulator. The y-axis is in dB and the x axis is in MHz. As can be seen, the lower noise frequencies are attenuated. The exact frequency spectrum of the resulting noise shaping depends on the sampling rate, the integrator time constant, and the order of the filter.

Clearly, a single bit, digital representation of an analog signal has very little resolution. The D/S modulator 32 of FIG. 2A is very difficult to analyze in the time domain because of the apparent randomness of the single bit nature of the data. For any given input value in a single sampling interval, data from the latched comparator 40 is virtually meaningless. A meaningful value results only when a large number of samples are averaged. If the input signal $V_{in}$ is near positive full scale, it is clear that there will be more 1s than 0s in the bit stream. Likewise, for signals near the negative full scale, there will be more 0s than 1s in the bit stream. For input signals near the midscale, there will be approximately an equal number of 1s and 0s.

After the quantization noise has been shaped by the D/S modulator 32, the output of the D/S converter 30 is further processed by the digital filter and decimator circuit 34. The purpose of the digital filter is two fold. First, the digital filter acts as an anti-aliasing filter with respect to the final sampling rate, $f_S$. Second, the digital filter filters out the higher frequency noise produced by the noise shaping process of the D/S modulator 32. Final data reduction is performed by digitally resampling the filtered output using a process called decimation. Decimation is the process of resampling at a lower rate. Decimation can be viewed as the method by which redundant signal information introduced by the oversampling process is removed.

FIG. 3 shows a multi-bit D/S converter 50 in block diagram form. The multi-bit D/S converter 50 includes a multi-bit D/S modulator 52 connected to a multi-bit digital filter and decimation circuit 54. The multi-bit D/S modulator 52 further includes a summing node 56, a filter 58, a multi-bit A/D converter 60, and a multi-bit internal D/A converter 62.

The multi-bit D/S modulator 50 of FIG. 3 operates similarly to the single-bit D/S converter of FIG. 1. The output of the summing node 56 is low-pass filtered by filter 58 and converted into a multi-bit digital signal by multi-bit internal A/D converter 60 operating at oversampling rate $kf_S$. The multi-bit D/A converter 62 is connected via a feedback loop between the output of the multi-bit A/D converter 60 and an input node of the summing node 56, whereby the analog signal output of the D/A converter 62 is subtracted from the analog signal input $V_{in}$. Again, the output of D/A converter 62 approaches that of the analog input signal $V_{in}$ due to the feedback involved. Digital filter and decimation circuit 54 removes quantization noise shaped into the higher frequencies and resamples the oversampled digital signal at rate $f_S$.

The multi-bit D/S converter 50 of FIG. 3 provides benefits over the single bit D/S converter 10 of FIG. 1. Namely, the multi-bit D/S converter 50 provides more resolution and less quantization noise. Additionally, the multi-bit D/S converter 50 is more stable than single bit D/S converters. However, the multi-bit D/S converter suffers from linearity errors introduced by the internal multi-bit D/A converter 62. Single bit D/S converters on the other hand do not produce linearity errors.

Linearity error is the inability of the multi-bit D/A converter to accurately translate a digital input value into an analog current or voltage. In other words, given a particular digital input, the resulting analog output of the multi-bit internal D/A converter 62 approximates the digital value but is not exactly equal to the digital value. In reality, the actual analog output differs from the digital input value by an amount equal to the linearity error.

FIG. 4 shows a graphical comparison of an ideal linear vs. non-ideal, non-linear multi-bit D/A converter. The horizontal axis represents the codes or multi-bit digital signals applied to the inputs of both types of multi-bit D/A converters, ideal and non-ideal. The vertical axis represents the analog signal output therefrom. Line L represents the transfer function of the ideal or linear D/A converter. Line NL represents the transfer function of the non-ideal or non-linear D/A converter. Variations between the two lines represent the linearity errors. The distance between points on a vertical line through both line L and the line NL represent the linearity error produced by the non-ideal D/A converter for a particular input code. For example, if digital code x is input to both the ideal D/A converter and the non-ideal D/A converter, the respective outputs would be $Y_L$ and $Y_{NL}$. The difference in voltage $\Delta Y$ represents the linearity error corresponding to digital code x. This linearity error is viewed as noise and degrades the ultimate signal to noise ratio of the D/S converter which contains the non-linear D/A converter. This linearity error is static in nature and independent of frequency and voltage.

The source of linearity errors can be traced to the internal current generators of the multi-bit D/A converter. FIG. 5 shows, in schematic form, a simplified D/A converter 70 employing a number of internal current generators 72. Each of the internal current generators 72 is selectively connected to an output node 74 via switches 76. Each switch 76 contains an input configured to receive one bit of the digital code inputted to the D/A converter 70. For example, switch $S_{N-1}$ is controlled by the most significant bit of the input digital code. When the most significant bit is 1, the associated current generator is connected to summing node 74. Thus, given a particular digital input code, the output of one or more of the current generators 72 is connected to the summing node 74.

If the D/A converter 70 was ideal and contained ideal current generators, current would be generated therefrom in integer units. For example, if the D/A converter 70 of FIG. 5 was an ideal 3 bit D/A converter, and a digital code inputted thereto equaled 111, the three ideal internal current generators 72 would generate 4, 2, and 1 units of current, respectively. However, internal current generators are rarely ideal. Given an input code 111, the non-ideal set of current generators, for example, might generate 4.05, 1.98, and 1.01 units of current, respectively.

The linearity error produced by the internal current generators can be further traced to a variety of causes, chief of which is the inability of integrated circuit manufacturers to form, in silicon, current generators having identical geometries. Several other causes can be related to the linearity error. Over time and use, the internal current generators may wear differently. Moreover, temperature variations may occur between the internal current generators. In any event, the physical differences between internal current generators in a D/A converter, even though slight, can produce significant errors in the translation of a digital input code into an analog equivalent.

Single bit D/A converters do not employ multiple current generators. As such, single bit D/A converters do not exhibit the non-linearity characteristics of multi-bit D/A converters. Accordingly, single bit D/S converters employing a single bit internal D/A converter, such as shown in FIG. 1, do not suffer from linearity errors. To this end, single bit D/S converters are advantageous over multi-bit D/S converters. Thus, while it is known that the resolution and stability of a multi-bit D/S converter is superior to that of a single bit D/S converter, single bit D/S converters are superior to multi-bit D/S converters to the extent that a single bit D/S converter produces less linearity error when compared to the linearity error produced by the multi-bit D/S converter. If it were not for the linearity errors caused by the internal multi-bit D/A converter, designers would generally prefer to use multi-bit D/S converters over single bit D/S converters.

It is desirable to have a multi-bit D/S converter in which the non-linearity produced by the internal D/A converter is removed or otherwise reduced.

U.S. Pat. Nos. 5,781,137; 5,781,138; 6,016,112; and 6,049,298 describe a system and method which operate to calibrate the A/D converter to eliminate or otherwise reduce linearity errors in the multi-bit A/D converter. The technique disclosed in these patents includes applying a known analog waveform, such as a pure sine wave, to an input of the A/D converter, or to a portion of the A/D converter, and generating digital signals representative of the pure sine wave. A number of the digital signals output from the converter are recorded. These recorded digital signals contain hidden information regarding the linearity errors associated with the A/D converter. The linearity error information can be extracted and used in deriving correction coefficients and constructing a linearity error correction circuit. The linearity error correction circuit then can be used to correct for linearity errors in the A/D converter.

The system and method described in the above patents utilize a waveform generator to provide an analog waveform signal to the A/D converter. The analog waveform is used to stimulate each of the current generators of the A/D converter in order to gather linearity error information about each of the current generators. In the embodiment described in the above patents, a sine wave generator is used to provide a sine wave signal to the A/D converter. However, a waveform generator is an expensive component, adding cost and reducing board area for other devices.

U.S. patent application Ser. No. 09/351,759, now U.S. Pat. No. 6,232,897, titled "System and Method for Calibrating an Analog to Digital Converter Through Stimulation of Current Generators" describes a system for calibrating an analog to digital (A/D) converter without requiring use of a waveform generator. In the method described in this application, in performing the calibration technique, a constant analog signal, such as a logical ground, or no input signal, is applied to the A/D converter, and the resulting output of the A/D converter is recorded. Thus, for example, the inputs of the A/D converter may be left floating, and the resulting output of the A/D converter is recorded. The A/D converter includes a switching element which may be comprised in the internal D/A converter of the A/D converter. During this recording, the switching element operates to change the manner in which the internal D/A converter decodes the received digital signal one or more times. The switching element may operate a plurality of times using different switching patterns. Each of the switching patterns involve different connections between the inputs of the internal D/A converter and the respective current generators. Thus the plurality of different switching patterns ensure that a majority or all of the current generators within the D/A converter are toggled or stimulated by the constant analog input signal. The recorded digital signals thus contain hidden information regarding the linearity errors associated with a majority or all of the current generators in the internal D/A converter. This linearity error information is then used in calibrating the A/D converter.

In addition, the system and method described in the above patents requires the digital output of the modulator to be stored into a RAM before the digital output is analyzed. This analysis is rather complex and requires a 'least squares' algorithm to be solved. This is normally done in the host computer for the computer board or device containing the A/D converter.

Because of these requirements the method described in the above patents is expensive to implement. It is desirable to be able to calibrate the modulator without the need for a precision sine wave generator, without the need for storing signals in memory, and without the need for executing a complex algorithm in a host computer.

Therefore, an improved system and method is desired for calibrating an A/D converter.

SUMMARY OF THE INVENTION

One embodiment of the present invention comprises a system and method for calibrating an analog to digital (A/D) converter without requiring use of a waveform generator, without the need for storing signals in memory, and without the need for executing a complex algorithm in a host computer. The present invention thus provides an improved A/D converter with reduced cost.

The present invention may be comprised in any of various systems which utilize a multi-bit delta sigma converter. For example, the system may be comprised in a computer-based data acquisition (DAQ) system, the system comprising a computer system and a DAQ device comprised in or coupled to the computer system. The DAQ device may include the A/D converter according to one embodiment of the present invention. The present invention may be used with any of various types of A/D converters, including integrating A/D converters, flash A/D converters, sigma-delta A/D converters, sub-ranging A/D converters, and successive approximation A/D converters, among others. The A/D converter includes, for example, one or more internal digital to analog (D/A) converters which may generate linearity errors.

In one embodiment, in performing the calibration technique, the input of the A/D converter may be left unconnected or shorted, and the coefficients may be derived by a real time analysis of the digital output, preferably using a dynamic element matching technique. This analysis may be performed by an on-board DSP used in performing decimation in the A/D converter.

The A/D converter being calibrated includes an internal D/A converter. The internal D/A converter includes a plurality M of current generators, wherein one or more of the current generators produces linearity errors in the A/D converter. The A/D converter also includes a digital correction unit that is configurable with a set of correction values. The correction values are determined from coefficients $E(n)$ for n=0 to M−1, wherein each coefficient $E(n)$ is associated with one of the current generators in the internal D/A converter.

One embodiment of the calibration method for configuring a digital correction unit for an analog to digital (A/D) converter operates as follows.

a) For each of a plurality of possible values of a coefficient $E(n)$:

configure the digital correction unit with a current set of correction values, wherein the current set of correction values includes a value based on one of the possible values of $E(n)$;

operate the A/D converter, wherein operation uses dynamic element matching in the internal D/A converter;

determine a noise value from output samples of the A/D converter;

b) select one of the possible values for $E(n)$ that produces the least noise value;

perform steps a) and b) for a plurality of coefficients E to produce a final set of coefficients E; and configure the digital correction unit with correction values based on the final set of coefficients E;

wherein the digital correction unit is useable in correcting for linearity errors in the A/D converter.

This linearity error information is then used in calibrating the A/D converter.

In another embodiment, the method for configuring the digital correction unit for an analog to digital (A/D) converter is performed during operation of the A/D converter on received input signals of interest, i.e., during operation of the A/D converter on real data. The method comprises first receiving an input signal of interest and performing an analog low pass filter operation on the received input signal of interest. The A/D converter then operates on the received input signal of interest to produce output samples. The digital correction unit is configured with various different sets of correction values during operation of the A/D converter. For each of the different possible sets of corrections values, a digital high pass filter operation is performed on respective output samples of the A/D converter. The high pass filtered output samples are then examined, such as by determining a noise value from the output samples, and one of the sets of correction values is selected in response, e.g., the set that produces the least AC noise. The above process may be performed iteratively to produce a final set of correction values. The digital correction unit may then be configured with the final set of correction values. The configured digital correction unit is then useable in correcting for linearity errors in the A/D converter.

BRIEF DESCRIPTION OF THE DRAWINGS

A better understanding of the present invention can be obtained when the following detailed description of the preferred embodiment is considered in conjunction with the following drawings, in which:

FIG. 9 is a block diagram illustrating a multi-bit A/D converter employing one embodiment of the present invention, wherein FIG. 9 illustrates the A/D converter configured for normal acquisition operation and calibration operation;

Figure 1:
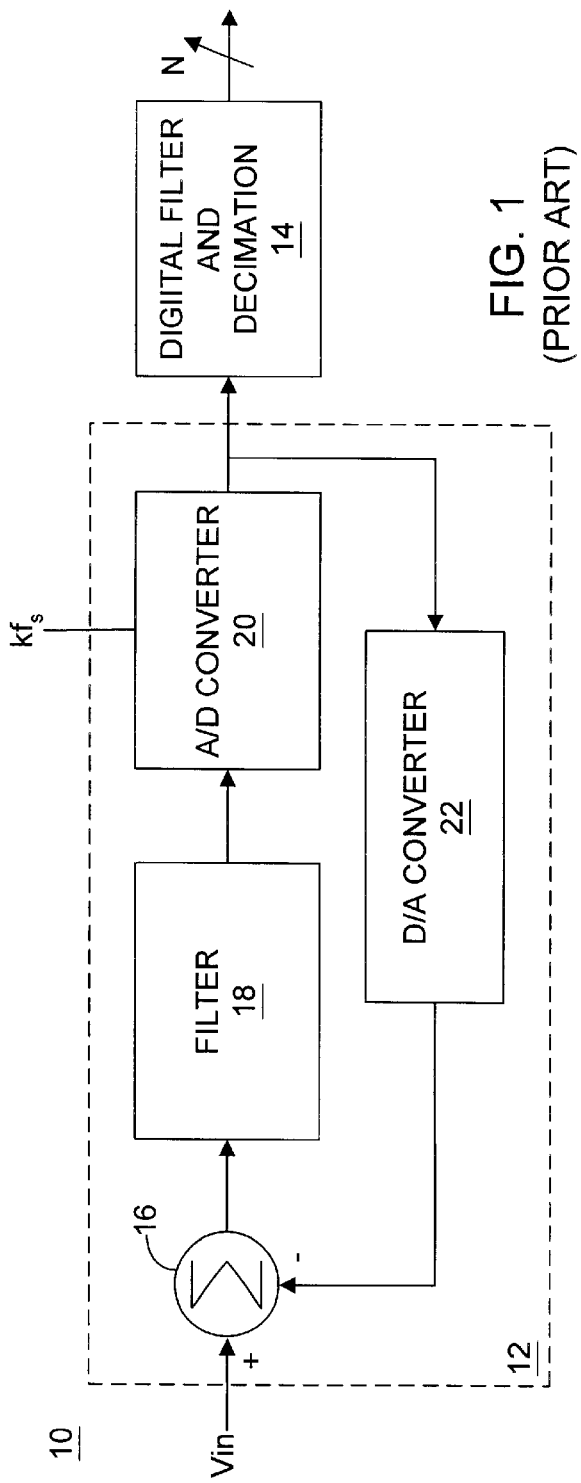
FIG. 1 represents a prior art single bit D/S converter in block form.
Figure 2A:
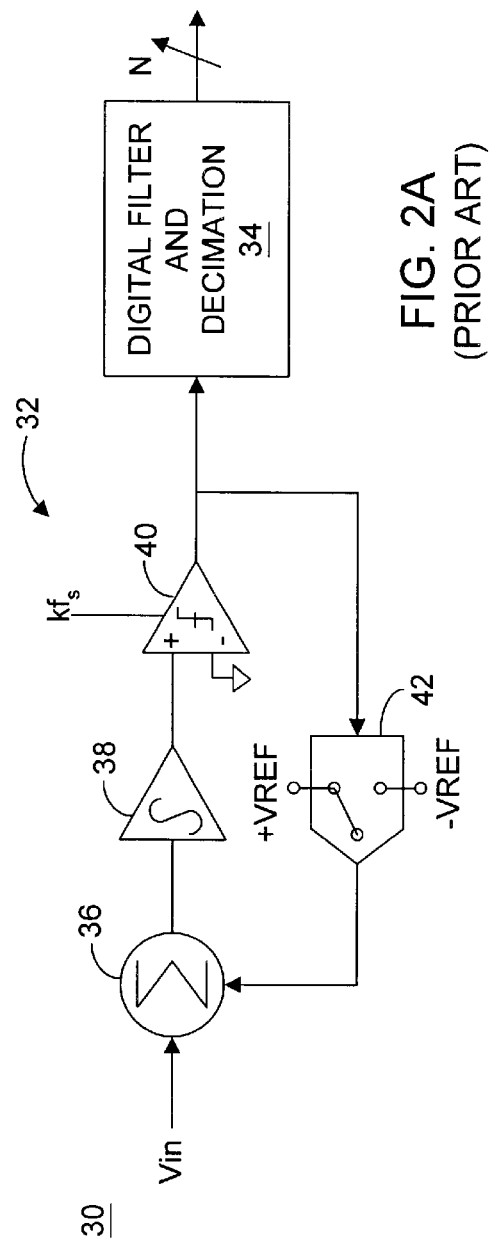
FIG. 2A represents a prior art single bit D/S converter in schematic form.
Figure 2B:
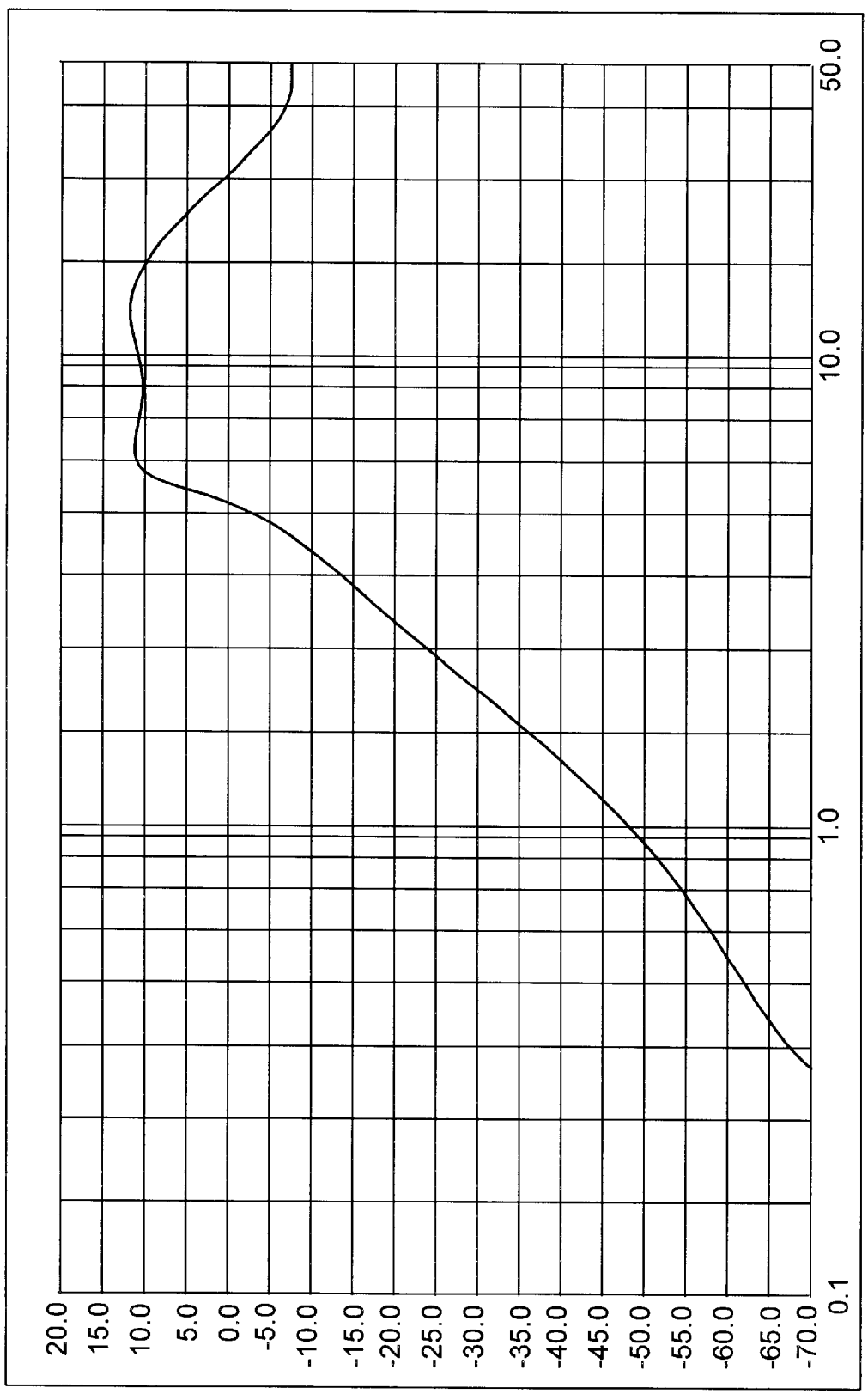
FIG. 2B represents a frequency response of the quantization noise of a D/S modulator.
Figure 3:
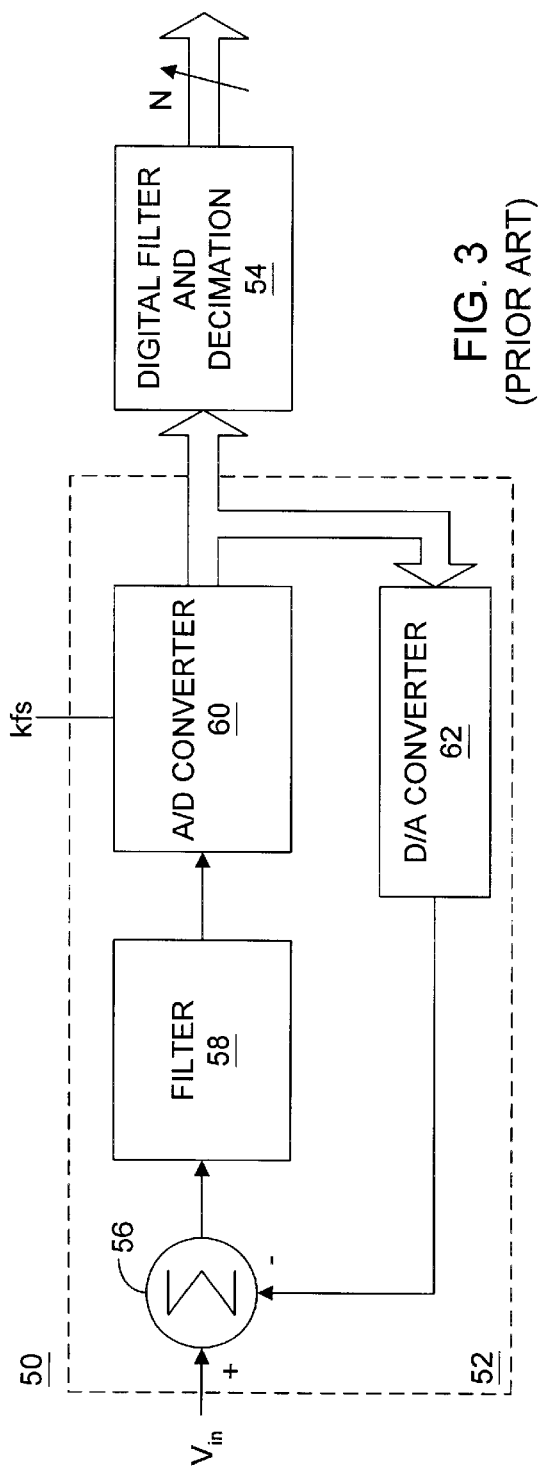
FIG. 3 represents a prior art multi-bit D/S converter in block form.
Figure 5:
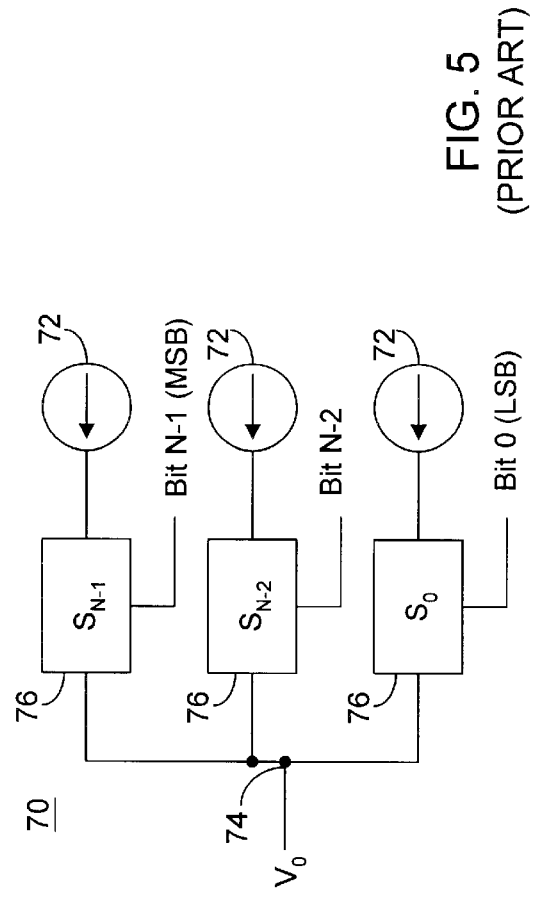
FIG. 5 represents a prior art D/A converter in schematic form.
Figure 4:
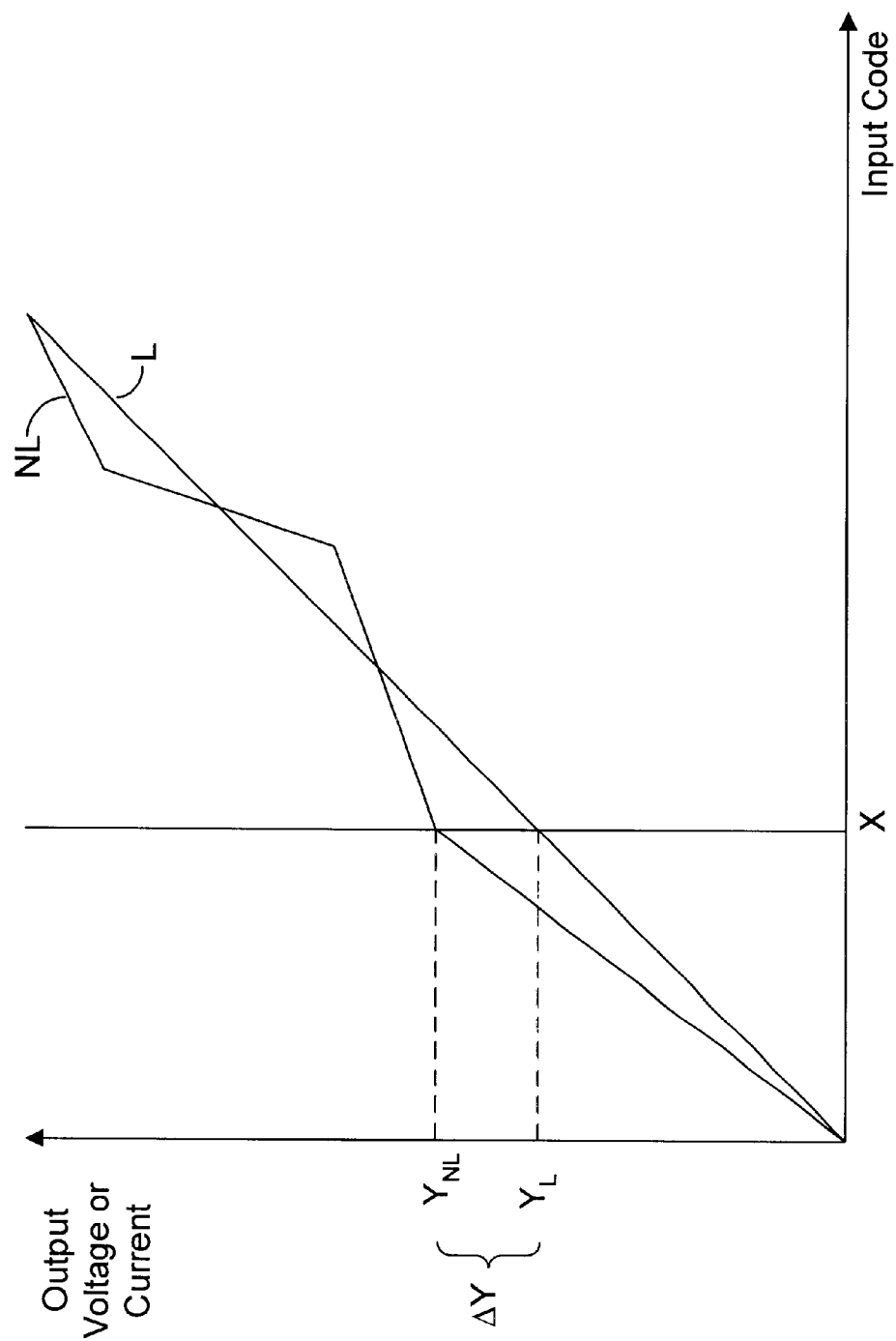
FIG. 4 is a graph representing transfer characteristics of an ideal and a non-ideal multi-bit D/A converter.
Figure 6:
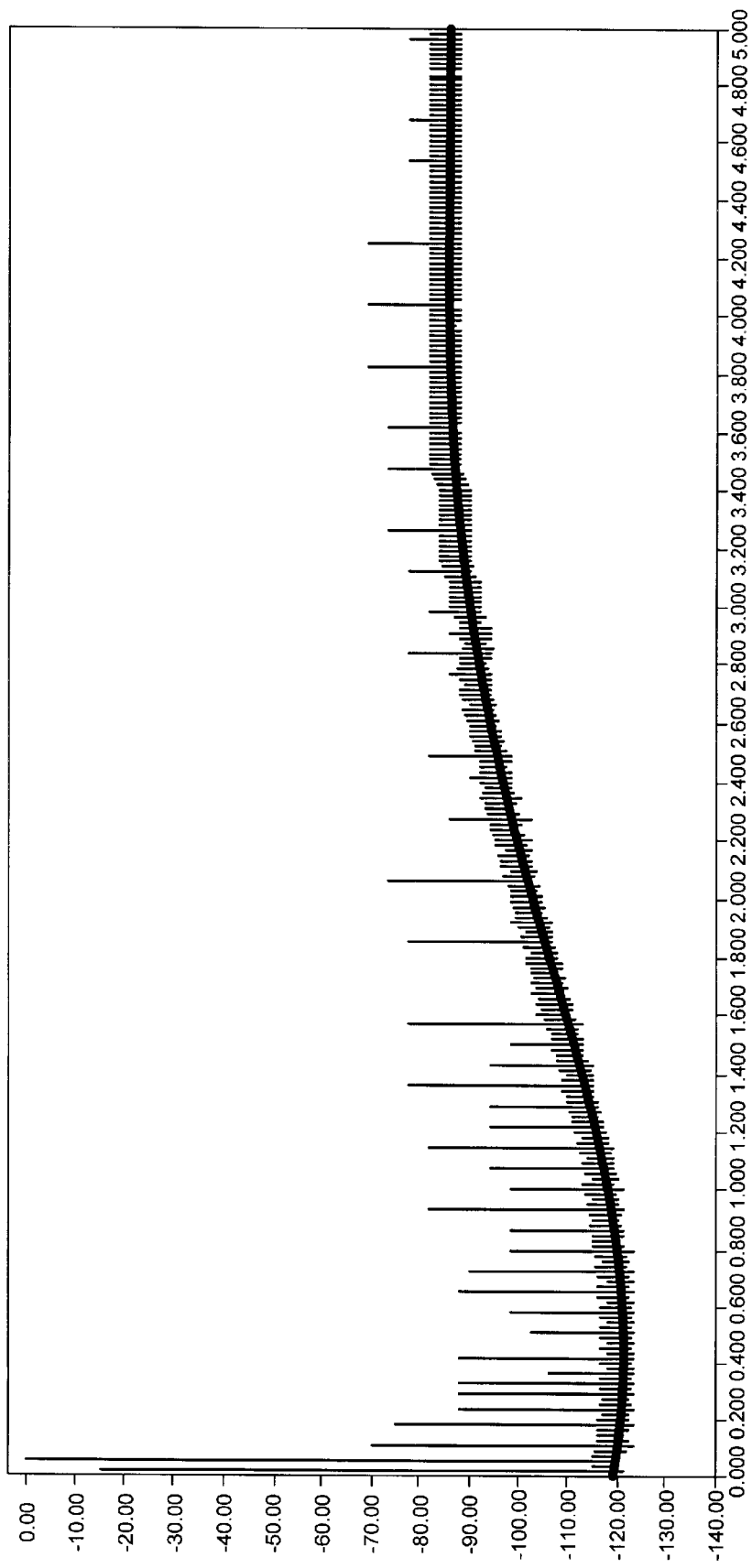
FIG. 6 illustrates the frequency spectrum from a multi-bit D/S converter which has linearity errors.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

Incorporation by Reference

The following are hereby incorporated by reference as though fully and completely set forth herein:

U.S. Pat. No. 5,781,138 titled "System and Method for Generating a Sigma-Delta Correction Circuit" and filed Dec. 23, 1996, whose inventor was Niels Knudsen;

U.S. Pat. No. 5,781,137 titled "System and Method for Reducing Errors in a Delta Sigma Converter" and filed Dec. 23, 1996, whose inventor was Niels Knudsen;

U.S. Pat. No. 6,049,298 titled "System and Method for Generating a Sigma-Delta Correction Circuit" and filed Nov. 25, 1998, whose inventor was Niels Knudsen;

U.S. Pat. No. 6,016,112 titled "System and Method for Reducing Errors in a Delta Sigma Converter" and filed Nov. 25, 1998, whose inventor was Niels Knudsen;

U.S. Pat. No. 6,020,838 titled "System and Method for Generating a Sigma-Delta Correction Circuit Using Matrix Calculation of Linearity Error Correction Coefficients" and filed on Nov. 4, 1998, whose inventors were Niels Knudsen and Mark Whittington;

U.S. patent application Ser. No. 09/351,759, now U.S. Pat. No. 6,232,897, titled "System and Method for Calibrating an Analog to Digital Converter Through Stimulation of Current Generators", filed on Jul. 12, 1999; and Delta-Sigma Data Converters: Theory, Design, and Simulation, edited by Steven R. Norsworthy, Richard Schreier, and Gabor C. Temes, ISBN 0-7803-1045-4, IEEE Press, 1997.

FIG. 7—DAQ System

Figure 7:
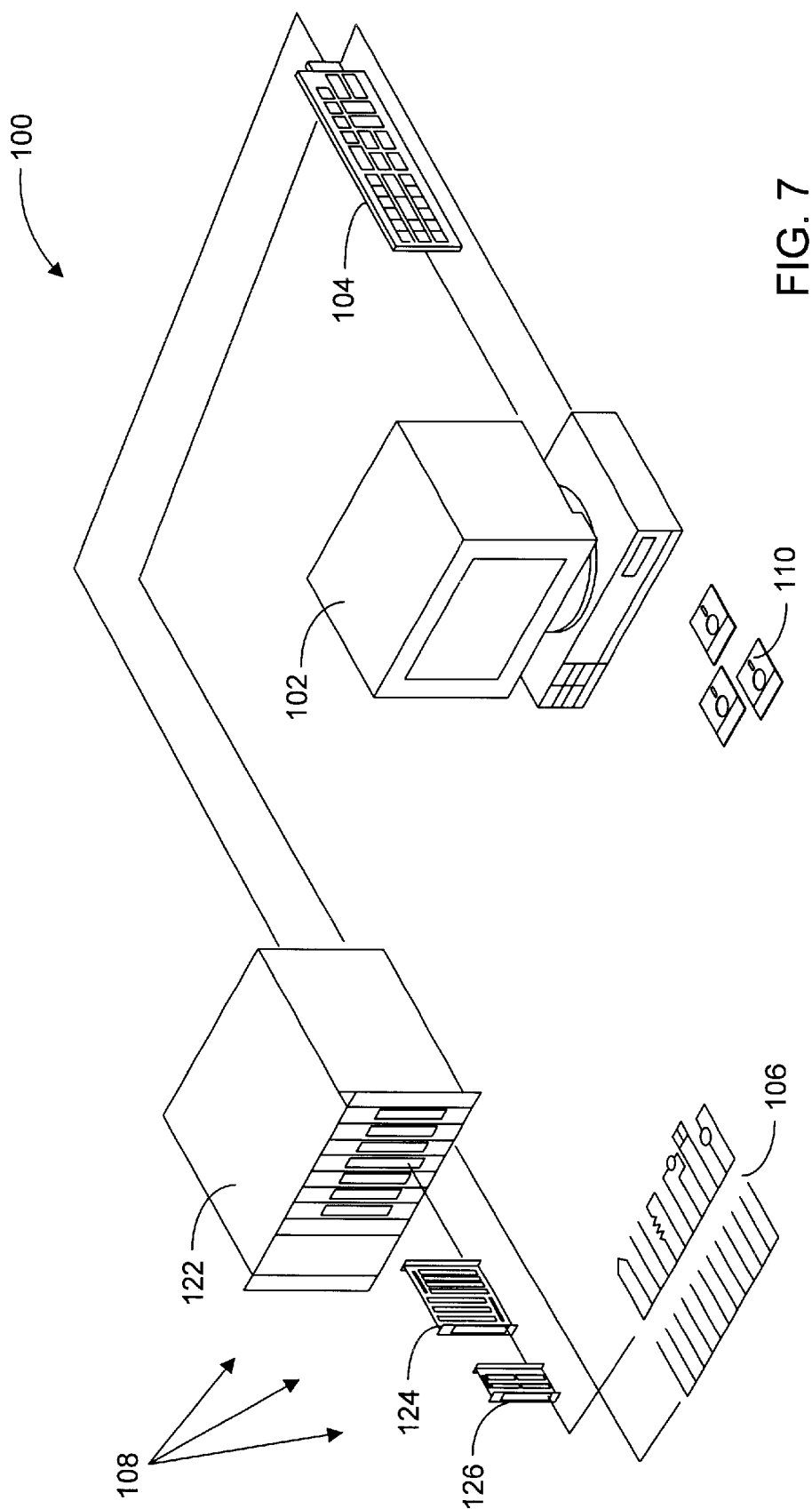
FIG. 7 illustrates a data acquisition (DAQ) data acquisition system which includes the multi-bit A/D converter employing one embodiment of the present invention.

FIG. 7 illustrates a system which includes an analog to digital (A/D) converter employing one embodiment of the present invention. In the preferred embodiment, the present invention is comprised in a data acquisition (DAQ) system. However, embodiments of the present invention may be included in any of various types of systems where an analog to digital converter is used, i.e., where analog data is converted to digital data. For example, the A/D converter of the present invention may be used in traditional instruments such as oscilloscopes, signal analyzers, etc., in computer-based instruments, or in computer-based data acquisition systems, among others. Examples of systems where the present invention may be used include data acquisition systems, instrumentation systems, test and measurement systems, industrial automation systems, process control systems, audio systems, and video acquisition systems, among others.

Embodiments of the present invention may be used with any of various types of A/D converters, including integrating A/D converters, flash A/D converters, sigma-delta A/D converters, sub-ranging A/D converters, and successive approximation A/D converters, among others. The A/D converter includes, for example, one or more internal digital to analog (D/A) converters which may generate linearity errors (also referred to as linear errors). In the following description, the present invention is described with reference to a delta-sigma (also called sigma-delta) A/D converter as one example of the operation of the present invention. The present invention is preferably used with a delta-sigma A/D converter. However, this description does not limit the invention to use with only delta-sigma (D/S) A/D converters, but rather as noted above the present invention may be used with any of various types of A/D converters.

FIG. 7 shows an illustrative DAQ system 100. The system 100 comprises a computer 102, a DAQ device or board 104 coupled to the computer 102, and transducers 106 or other detecting means which provide field electrical signals to the DAQ device 104, optionally through signal conditioning circuitry 108. The DAQ board 104 is preferably comprised in the computer system 102, but is shown external to the computer system 102 for illustrative purposes. In the example system of FIG. 7, the DAQ board 104 includes the A/D converter according to one embodiment of the present invention. The term "data acquisition" used in this specification is intended to encompass data generation as well as data acquisition, one example being with reference to instrumentation and process control systems.

The computer 102 may include various standard components, including at least one central processing unit (CPU), non-volatile memory, such as a hard drive, system memory, one or more buses, and a power supply.

In one embodiment, the computer 102 comprises input/output (I/O) slots into which the DAQ device 104 is coupled. The DAQ device 104 may thus be an internal add-in card or board. The DAQ device 104 may also be an external device. In other embodiments, the computer 102 comprises a VXI (VME Extensions for Instrumentation) chassis and bus, a GPIB (General Purpose Interface Bus), a serial port or parallel port by which the DAQ device 104 is coupled to the computer 102. Examples of computer 102 are IBM-compatible personal computers, Apple Macintosh computers, and Sun Microsystems workstations and operating systems which execute on them.

In one embodiment, the transducers 106 are coupled directly to the DAQ device 104. In another embodiment, the signals received by the transducers 106 are conditioned by the signal conditioning circuitry 108 for presentation to the DAQ device 104 as shown. An example of signal conditioning circuitry 108 is Signal Conditioning Extensions for Instrumentation (SCXI) circuitry. SCXI is an open architecture, multi-channel signal conditioning front-end system for DAQ devices. SCXI comprises an external chassis 122 housing signal conditioning modules 124 and optionally terminal blocks 126 for amplifying, multiplexing, and isolating field signals. The signal conditioning modules advantageously reduce the introduction of noise into the signals transmitted to the DAQ device 104.

The transducers 106 and other detecting means provide the field signals representing a process, physical phenomena, equipment being monitored or measured, etc. to the DAQ device 104. Examples of the transducers 106 are strain gauges, thermocouples, thermistors, photoconductive cells, microphones, and piezoelectric transducers, among others.

Examples of DAQ device 104 are the following products available from National Instruments Corporation: E Series Multifunction I/O boards, such as the AT-MIO-16 series analog input boards, the AT-AO-6/10 series analog output boards, the PC-DIO-96 digital I/O board, and the PC-TIO-10 counter/timer I/O board.

The DAQ device 104 may include a memory medium (e.g., 212, FIG. 9) on which computer programs according to the present invention may be stored. The computer programs may be executed by a processor on the DAQ device 104 to calibrate the A/D convert on the DAQ device 104.

Figure 8:
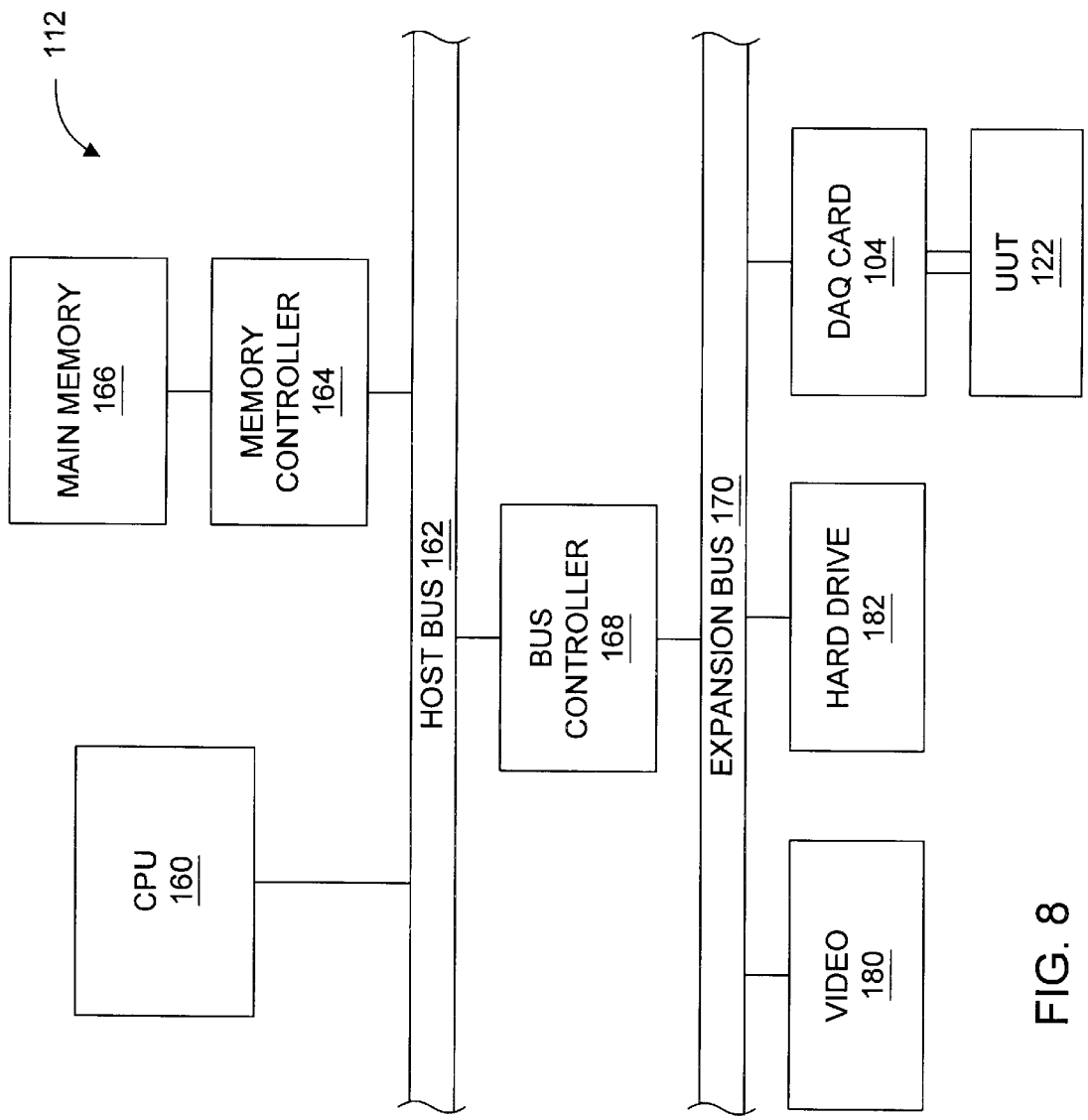
FIG. 8 is a block diagram illustrating the computer system of FIG. 7.

FIG. 8—Computer System Block Diagram

FIG. 8 is a block diagram illustrating an example computer system architecture of the computer system 102 of FIG. 7. FIG. 8 illustrates a representative block diagram of the computer system 102 of FIG. 7, and it is noted that the computer system 102 may have various different architectures, as desired. The elements of a computer system not necessary to understand the operation of the present invention have been omitted for simplicity.

The computer system 102 includes a central processing unit or CPU 160 which is coupled to a processor or host bus 162. The CPU 160 may be any of various types, including an x86 processor such as the Pentium class from Intel, a PowerPC CPU from the Motorola family of processors, as well as others.

Main memory 166, also referred to as system memory 166, is coupled to the host bus 162 by means of memory controller 164. The system memory 166 stores various software used in data acquisition system 100, including DAQ driver level software and a DAQ application. The DAQ driver level software is preferably NI-DAQ software from National Instruments.

Host bus 162 is coupled to an expansion or input/output bus 170 by means of a bus controller 168. The bus controller 168 preferably comprises standard PC chipset logic. The expansion bus 170 is preferably the PCI (Peripheral Component Interconnect) bus, and the bus controller 168 is preferably chipset logic, available from Intel Corporation. The expansion bus 170 includes slots for various devices, including video 180.

A non-volatile memory or hard drive 182 is comprised in the computer system 102 and may be coupled to the expansion bus 170 or to the chipset 168, or to other logic. The non-volatile memory 182 stores an operating system, the DAQ driver software, as well as other application programs, for loading into the system memory 166 as known in the art.

The data acquisition board or device 104 according to one embodiment of the present invention is coupled to the expansion bus 170. The DAQ device 104 is operable to receive and/or provides signals from/to an external system or device. The DAQ device 104 is preferably configurable to acquire/generate data from/to an external system or a unit under test. The DAQ device 104 includes the analog to digital (A/D) converter according to the present invention. It is noted that the DAQ device 104 may take various different forms and may be comprised in the computer 102 or external to the computer 102, as desired.

In the preferred embodiment, the present invention is used with a data acquisition system. Thus, as shown, a DAQ interface card 104 is coupled to the expansion bus 170. However, the system and method of the present invention may be used in any of various systems which include an analog to digital converter.

Figure 9:
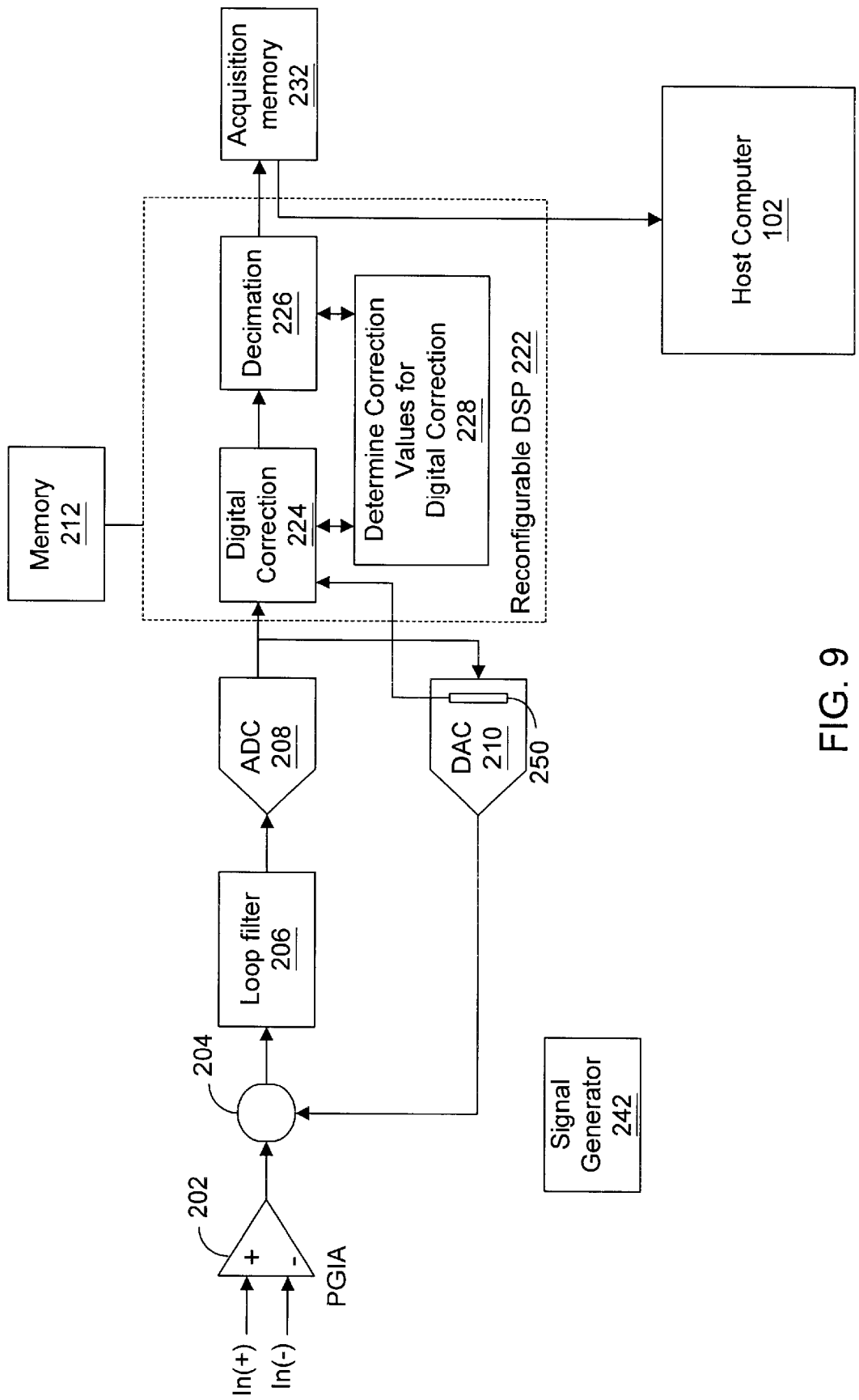

FIG. 9—DAQ Card Block Diagram

FIG. 9 is a block diagram of the DAQ card 104 of FIGS. 7 and 8 according to one embodiment. More particularly, FIG. 9 shows an example A/D converter, in this case a multi-bit D/S converter, employing one embodiment of the present invention. As noted above, the present invention may be used with any of various types of A/D converters, and in the present description the present invention is described with reference to a delta-sigma A/D converter as one example of the operation of the present invention. However, the present invention may readily apply to other types of A/D converters which include internal D/A converters. Also, the A/D converter of the present invention may be used in various systems or devices, and the A/D converter is described below as being comprised in DAQ device 104. Circuitry comprised on the DAQ device 104 which is not relevant to the present invention is not shown in FIG. 9 for simplicity.

The DAQ device 104 may include a PGIA (programmable gain instrumentation amplifier) 202 which receives In(+) and In(−) signals. The PGIA couples to the D/S converter of the present invention, which in turn couples to an acquisition memory 232. The acquisition memory is shown coupled to host computer 102. FIG. 9 illustrates normal operation of the A/D converter when acquiring analog waveforms to the host 102 via the acquisition memory 232. FIG. 9 also illustrates the configuration of the A/D converter during calibration operations.

Unlike the implementation described in U.S. Pat. Nos. 5,781,138 and 5,781,138, the DAQ device 104 does not require an on-board signal generator 242, such as a sine wave generator, for use in the calibration. This reduces the cost of the DAQ device 104 while still allowing for advanced calibration techniques to be performed. In the preferred embodiment, the DAQ device 104 includes a logical ground or constant voltage source which is used for calibration.

Also, unlike the implementation described in U.S. patent application Ser. No. 09/351,759, the host computer 102 is not required to perform calibration processing off-line to determine the proper calibration coefficients, but rather an on-board processor (e.g., DSP 222) can perform the calibration processing, preferably in real time during operation of the A/D converter.

The D/S converter includes a delta sigma modulator, wherein the delta sigma modulator comprises a summing node 204, a loop filter 206, a multi-bit internal A/D converter 208, and a multi-bit D/A converter 210. The D/S converter may include a switching element or barrel shifter 250 according to one embodiment of the present invention. The barrel shifter 250 is preferably comprised in the internal D/A converter 210. The operation of the barrel shifter 250 is discussed further below.

This embodiment of the present invention is shown as being employed in a first order, single pole D/S converter. However, as noted above, the present invention is applicable to other types of D/S or A/D converters.

A processing unit or DSP (processor) 222, such as an FPGA (field programmable gate array) or a programmable digital signal processor (DSP), may be coupled to the output of the internal A/D converter 208. The processor 222 may implement a linearity error correction circuit 224 and a digital filter and decimation circuit 226, which are shown coupled to the output of the internal A/D converter 208. When a programmable DSP is used, a memory 212 may be coupled to the DSP 222, wherein the DSP 222 executes instructions from the memory. The processor may implement one or both of the digital correction block 224 and the decimation block 226. Thus, the processing unit 222 thus may operate to perform the digital correction operations of the present invention, preferably through implementation of a look-up table.

According to one embodiment of the present invention, the processing unit or processor 222 may also operate to also perform the calibration calculations, represented by block 228, used in determining the correction values stored in the digital correction block 224. Thus the processor 222 may perform the calibration calculations in real time, as opposed to the host computer having to perform these calculations off-line in a non real-time manner.

The processor 222, may be implemented in any of various ways, including a processing unit such as a DSP, CPU, microcontroller, etc., a programmable device such as an FPGA, discrete digital or analog logic, or a combination of the above. In the following discussion, the term "DSP" is used to generally refer to the processing unit 222. The DSP 222 preferably operates to perform both the digital correction operation 224 and the decimation operation 226, as well as the calculation operations 228 for determining the correction values in the correction block 224.

During A/D operation, the D/S modulator comprising summing node 204, loop filter 206, multi-bit internal A/D converter 208, and multi-bit D/A converter 210, performs in substantially the same manner as prior art multi-bit D/S converters. Namely, filter 206 applies a low-pass filter function to the output of summing node 204. Typically the loop filter 206 includes one or more integrators (the loop may also include gain). The filtered signal in turn is converted into a digital equivalent by internal A/D converter 208. Internal D/A converter 210 is positioned in a feedback loop between the output of the internal A/D converter 208 and an input of the summing node 204. Thus, the output of the internal D/A converter 210 is translated into an analog equivalent which is subtracted from analog input signal $V_{in}$ inputted to summing node 204. Due to the feedback signal provided, the output of the internal D/A converter 210 approaches that of the input signal if the loop has enough gain.

As shown, the linearity error correction (digital correction) block 224 and the digital filter and decimation block 226 are placed in series between the D/S modulator and the acquisition memory 232. The digital filter and decimation circuit block 226, as implemented by DSP 222, preferably operates substantially in the same way as prior art digital filter and decimation circuits. Namely, the digital filter and decimation block 226 provides low-pass digital filtering and a resampling of the digital signals inputted thereto, where the resampling occurs at a rate $f_S$.

Linearity error (L/E) correction block or digital correction unit is connected to the output of the D/S modulator. Digital signals generated by the D/S modulator are corrected or linearized by the L/E correction circuit 224 before being digitally filtered and decimated. The L/E correction block 224 linearizes the D/S modulator 82 by removing or substantially reducing the linearity errors in output digital signals. The L/E correction block 224 removes or reduces linearity errors by adjusting the output of the D/S modulator to compensate for the linearity error. The L/E correction block receives information from the switching element 250 and from the ADC 208. The L/E correction block 224 uses this information to determine which of the current generators 72 internal to DAC 210 are active for each sample. By adding the correction values E(n) for the active generators 72 to the sample value produced by the ADC 208 the L/E correction block 224 calculates a corrected digital value. Given that the L/E correction circuit 224 linearizes the D/S modulator 82, the D/S converter 80 employing the present invention ultimately produces a digital signal having reduced linearity errors and a higher resolution. Accordingly, the number of bits representing the digital output of the digital filter and decimator 226 can be enhanced or increased.

In one embodiment, a logical ground or other constant analog signal may be selectively coupled to the input of the summing node to provide zero input to the D/S converter for calibration purposes, as discussed further below. Alternatively, a switch may be provided to allow the input of the summing node to "float" with zero input during calibration.

FIG. 9 also illustrates the configuration of the A/D converter during calibration. During calibration, a fixed or constant analog signal, e.g., a constant voltage or current, preferably a logical ground, may be connected to the input of the summing node 204, as shown. The logical ground operates to provide a constant input, preferably a zero input, to the input of the D/S converter.

A constant input will result in approximately zero AC output from an ideal DS after the decimator. The actual value of the constant input does not matter, since the AC_RMS value is computed, which is insensitive to the DC-component of the signal. The only restriction to the value of the constant input is that it should be within the output range of the internal D/A converter.

In one embodiment, no input is connected to the D/S converter during calibration. In other words, the input of the D/S converter may be left floating during calibration.

The D/S converter receives the zero or constant input and generates a plurality of samples S, which may be recorded in the acquisition memory 232. According to one embodiment, the barrel shifter or switching element 250 operates to selectively connect the inputs of the DAC 210 to different current generators within the DAC 210, preferably using a dynamic element matching technique, thereby causing different current generators to be stimulated for the purpose of calibration. The selective connecting is performed one or more times, preferably a plurality of times, using different a pre-determined or random pattern. Each of the switching patterns produces different connections between the inputs of the internal D/A converter and the respective current generators. Each of the different switching patterns is preferably applied for a certain period of time to ensure proper recording. Preferably, the method switches the patterns on a per sample basis. Thus, a new pattern may be used for each sample.

The different switching patterns ensure that most or all of the current generators within the internal DAC 210 are stimulated. The different switching patterns may involve pre-determined or programmed switching patterns or random switching patterns. If random are used, the accuracy is essentially a function of the number of recorded samples obtained. In addition to receiving sample data from the ADC 208, the digital correction block 224 also receives information from the switching block 250 internal to the DAC 210 regarding the switching pattern used for each sample.

Thus the switching element 250 operates to adjust connections to a plurality of the current generators in the internal D/A converter a plurality of times, wherein this adjusting of connections causes different ones of the current generators to be stimulated by the input to the A/D converter. Thus the samples S produced by the D/S converter carry linearity error information for most or all of the current generators within the DAC 210.

The output samples S may be analyzed in real time by the processor 222 to produce correction values used in the digital correction block 224. The output samples S may be recorded in the acquisition memory 232 for real time analysis, or the output samples S may be analyzed in real time without being stored in a memory. It is possible for the output samples S to be analyzed in real time without being stored in a memory because of the slow rate after the decimator. Below is a useful algorithm for executing the AC_RMS calculation without storing samples in memory:

1. A=0
2. B=0
3. SAMPLE_COUNT=0
4. Receive sample X
5. A=A+X*X
6. B=B+X
7. SAMPLE_COUNT=SAMPLE_COUNT+1
8. IF SAMPLE_COUNT IS INSUFFICIENT REPEAT STEP 4
9. A=A/SAMPLE_COUNT
10. B=B/SAMPLE_COUNT
11. B=B*B
12. A=A−B
13. AC_RMS=SQRT(A)

Step 13 may be omitted, since square(AC_RMS) also may be used for selecting the appropriate E(n).

As shown, the DSP 222 may be programmed to perform a decimation function 230 on the recorded samples S. The DSP 222 may also operate to extract linearity error information from these received signals.

In extracting linearity error information from the recorded signals, the method may optionally first remove high frequency noise from the recorded digital signals. It is noted that although the method may optionally first remove high frequency noise, this is not necessary because the decimator has already removed the high frequency noise.

The recorded digital signals (with high frequency noise removed) have a frequency band where zero energy is expected, and any signal content present in this band contains hidden linearity error information. The method then operates to extract linearity error information from the recorded digital signals, as described below.

After the processor 222 extracts the linearity error information from the recorded signals, the processor 222 then calibrates the A/D converter using this linearity error information. For example, in one embodiment, the processor 222 may operate to generate linearity error correction values. The linearity error correction values may then be stored in the digital correction block 224, to perform digital correction on the output of the D/S modulator. The digital correction block 224 is then used by the DSP 222 to perform linearity error correction during operation of the A/D converter.

After each calibration operation, the input of the A/D converter ground is reconnected to the input source. In other words, the input of the A/D converter is no longer shorted, i.e., the constant voltage or ground is disconnected from the input of the D/S converter, and the D/S converter is configured to receive a desired input using the newly configured digital correction block 224, i.e., using the configured DSP 222 and memory 212.

Figure 10:
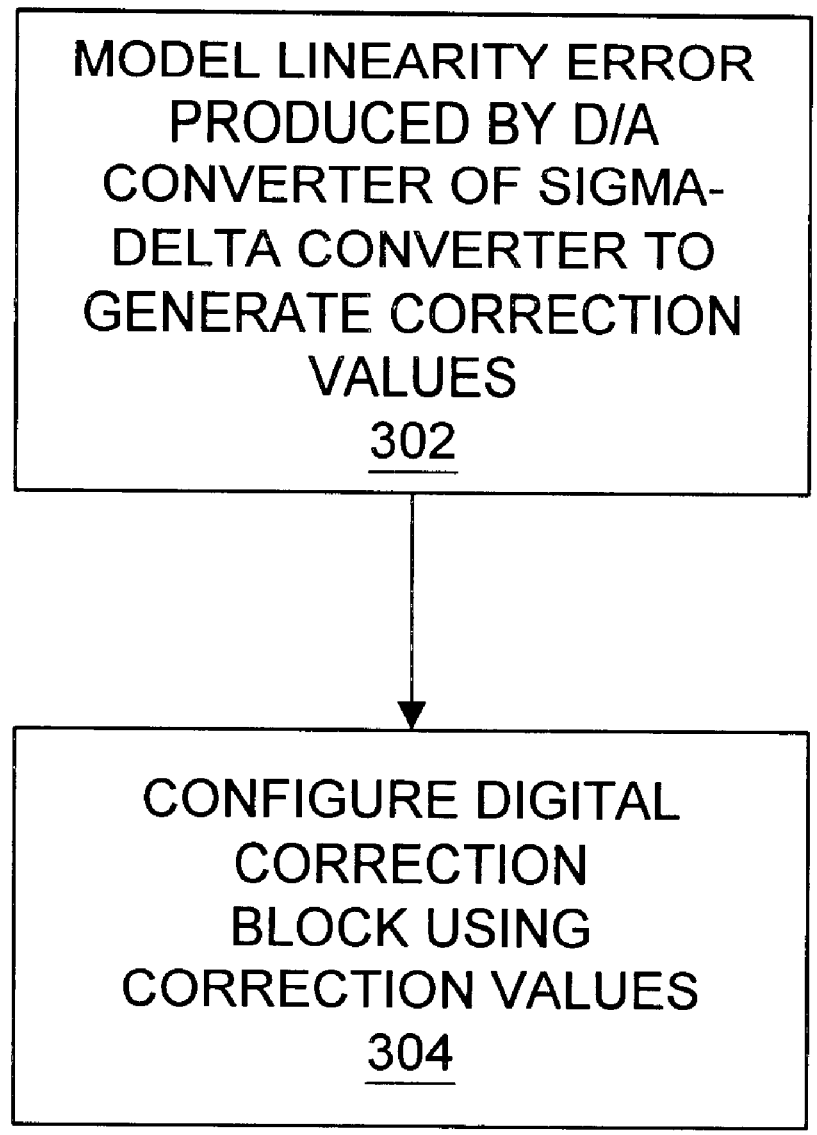
FIG. 10 is a top level flowchart which illustrates the method according to one embodiment of the present invention.

FIG. 10—Top Level Flowchart

FIG. 10 shows, in general terms, application of one embodiment of the present invention to a conventional multi-bit D/S converter.

In step 302 the DSP 222 determines the linearity error inherent in the D/A converter 210 and generates error correction values. The linearity error modeling performed in step 302 produces linearity error information associated with the D/A converter 210. The linearity error information contains information corresponding to active states of the current generators internal to the internal D/A converter 210 in the A/D converter. Operation of step 302 is shown in more detail in FIGS. 11 and 12. Based on the linearity error modeling, the DSP 222 determines error values E in step 302 and may generate corresponding correction values using the error coefficients E. Thus, in the preferred embodiment, the DSP 222 generates the correction values. However, it is noted that the correction values may be generated by processor 222 on the board 104, or by a combination of the DAQ device 104 and host computer 102, or by an external system.

Thereafter, in step 304, the linearity error correction values are used to configure or calibrate the L/E correction circuit 224 comprised on the board 104. For example, the determined correction values may be stored in the L/E correction circuit 224. In the preferred embodiment, as discussed above, the DSP 222 implements the L/E correction circuit 224.

Once the L/E correction circuit 224, i.e., the DSP 222, is properly configured, the delta sigma converter may be used for analog to digital conversion. Thus, as shown in FIG. 9, an input voltage $V_{in}$ is applied to the delta-sigma converter input summing node 204, $V_{in}$ is digitally sampled, and the digital samples are provided to the DSP 222 for L/E correction. The DSP 222 in turn translates the digital samples into values with reduced linearity errors.

Figure 11:
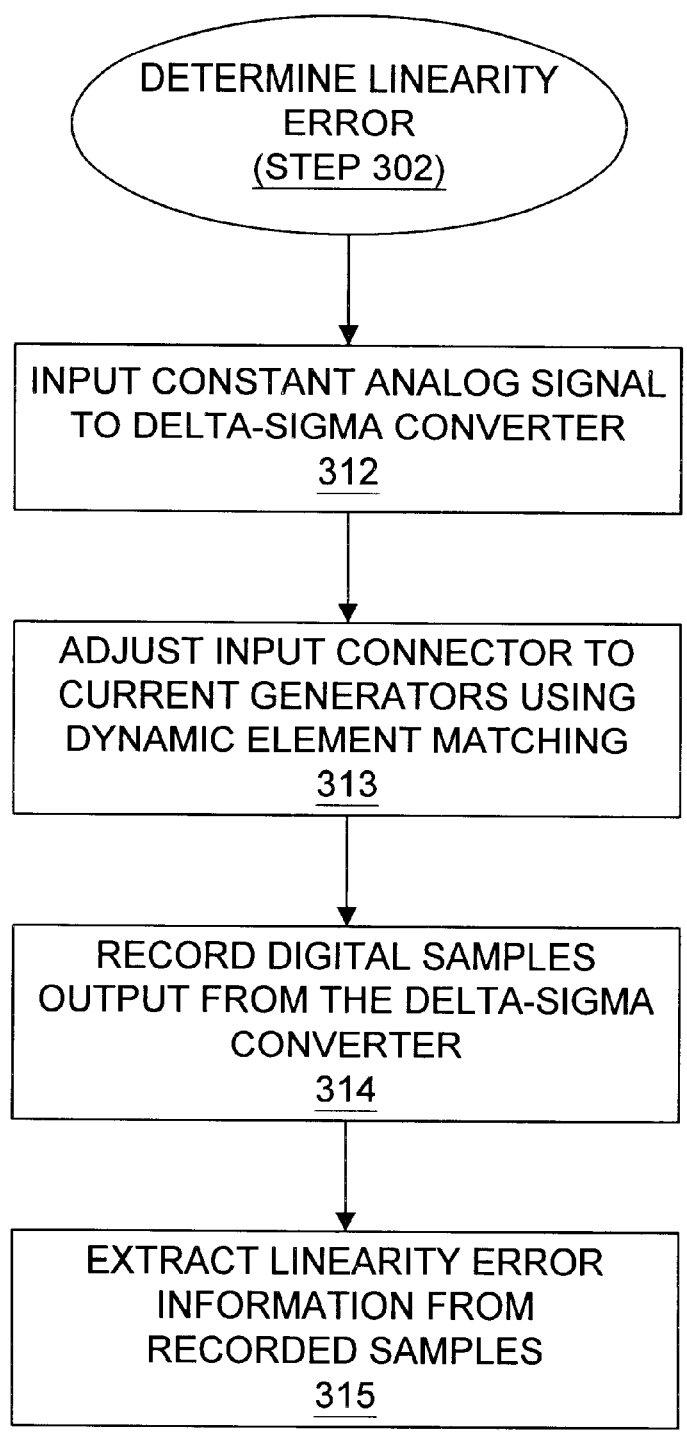
FIG. 11 is a top level flowchart diagram illustrating how linearity errors are modeled or extracted according to one embodiment of the present invention.

FIG. 11—Modeling of Linearity Errors and Generating Correction Values

With continuing reference to FIG. 10, FIG. 11 illustrates operation of step 302 of FIG. 10, i.e., FIG. 11 illustrates modeling of linearity errors and generation of correction values performed in step 302 of FIG. 10.

As shown, in step 312 a constant analog signal may be input to the D/S modulator. This may be accomplished by shorting the input of the A/D converter, i.e., by selectively connecting a constant analog source, such as a constant voltage source, e.g., logical ground, to the input of summing node 204. During calibration, the input to the D/S modulator is preferably a logical ground, although other types of constant voltages/currents may be used. It is noted that any of various analog sources may be used during calibration.

In step 313 the barrel shifter or switching element 250 operates to adjust the connections to the current generators in the DAC 210 or 210A to cause different ones of the current generators to be stimulated. The barrel shifter 250 thus implements dynamic element matching in the A/D converter. The switching element 250 thus is operable to selectively or randomly adjust the connections to the current generators in the DAC 210 or 210A to cause different ones of the current generators to be stimulated by the constant input.

The switching element 250 utilizes one or more different dynamic element matching configurations to cause different ones of the current generators to be stimulated by the constant input. The A/D converter may use various types of dynamic element matching, including dynamic element randomization, dynamic element rotation (e.g., using a barrel shifter), individual level averaging, and noise-shaped element usage, among others. The operation of the A/D converter, including the digital correction block 224, during dynamic element matching is described in Delta-Sigma Data Converters: Theory, Design, and Simulation, edited by Steven R. Norsworthy, Richard Schreier, and Gabor C. Temes, referenced above, at pages 251–264, which is hereby incorporated by reference as though fully and completely set forth herein.

The dynamic element matching performed by the A/D converter system (performed in the internal D/A converter 210), e.g., as implemented by the switching element 250 comprised in the internal DAC 210, allows a much simpler analog input to be used during calibration while still enabling each of the current generators in the internal DAC 210 to be stimulated by the input. The digital correction block 224 also may include logic to account for the dynamic element matching performed in the A/D converter. More specifically, the digital correction block 224 may include logic that accommodates for the internal D/A converter's decoding scheme, which may change from sample to sample (or from sets of samples to sets of samples) during dynamic element matching.

In step 314 the acquisition memory 232 may collect and store a set S of digital samples of the output by the D/S modulator. Here it is noted that digital correction 224 and decimation 226 are performed on the output of the D/S modulator, and then the digital samples are recorded directly in the acquisition memory 232. The acquisition memory 232 may also store the switching pattern used in generating each recorded sample. This switching pattern information is used in the correction unit 224 in determining which current generator(s) were stimulated during generation of a respective output digital signal or sample.

With reference to the paragraph above, in one embodiment the switching pattern is not recorded into memory but only goes to the correction unit. The correction unit 224 receives sample values and switching pattern information from the DS modulator. From this information the correction unit 224 calculates which generator(s) were active. For the active generators the corresponding E(n) are selected and summed together in order to calculate the corrected value.

The digital samples output from the D/S converter are preferably continuously recorded in step 314. During the continuous recording performed in step 314, the switching element 250 operates to adjust the connections to the current generators in the DAC 210 (or 210A) one or more times according to dynamic element matching to cause different ones of the current generators to be stimulated.

Stated another way, steps 313 and 314 may be performed a plurality of times to ensure that a majority or all of the current generators are stimulated. Thus, step 313 is performed a plurality of times, wherein the switching element 250 operates to adjust the connections to the current generators in the DAC 210 or 210A a plurality of times to stimulate different ones of the current generators. This ensures that a majority or all of the current generators are stimulated. Step 314 is also performed a plurality of times to ensure that the digital samples are recorded.

After the set S of digital samples or digital signals are recorded in step 314, and the corresponding switching patterns are recorded in step 314, in step 315 linearity error information is extracted and correction values are calculated. Step 315 is preferably performed by the on-board DSP 222. The linearity error information E(n) may be extracted in many ways. In one embodiment, high frequency noise may first be removed from the samples, although this is not necessary because noise has already been removed by the decimator.

The recorded digital signals (with high frequency noise removed) have a frequency band where zero energy is expected, and any signal content present in this band contains hidden linearity error information. The method then operates to extract linearity error information from the recorded digital signals.

In the preferred embodiment, the calibration operation is performed as follows.

As opposed to a conventional multi-bit delta sigma converter, the multi-bit delta sigma converter employs dynamic element matching, which operates to stimulate all internal current generators even when the inputs are shorted. Thus the low end of the frequency spectrum contains information about the inaccuracies of all of the internal current generators.

During calibration, the digital section at the output of the A/D converter is configured for normal operation as shown in FIG. 9 (and as also shown in FIG. 8.14 of Delta-Sigma Data Converters: Theory, Design, and Simulation, referenced above). Thus, as shown, the A/D is followed by a digital correction block (linearization block) 224 and decimation block 226. Here it is noted that the digital correction block 224 accounts for the dynamic element matching performed, e.g., by accommodating for the decoding scheme used, which may change from sample to sample.

As described above, the A/D converter includes an internal D/A converter 250, wherein the internal D/A converter 250 includes a plurality M of current generators, wherein one or more of the current generators produces linearity errors in the A/D converter. The digital correction unit is configurable with a set of correction values, wherein the correction values are determined from coefficients E(n) for n=0 to M−1, and wherein each coefficient E(n) is associated with one of the current generators in the internal D/A converter. The correction values may be derived from the error coefficients E(n), or in some applications the correction values may themselves be the determined error coefficients E(n).

The correction unit 224 receives sample values and switching pattern information from the DS modulator. From this information the correction unit 224 calculates which generator were active. For the active generators, the corresponding E(n) are selected and summed together in order to calculate the corrected value.

When calibrating the A/D converter, the coefficients E(n) for each error source (each current generator), are "trimmed" in turn by monitoring the AC-RMS value at the output of the decimator. The coefficients are preferably trimmed or adjusted until a minimum AC-RMS value is obtained.

The method preferably operates as follows:

a) for each of a plurality of possible values of a coefficient E(n):

configure the digital correction unit with a current set of correction values, wherein the current set of correction values includes a value based on one of the possible values of E(n);

operate the A/D converter, wherein the operating uses dynamic element matching in the internal D/A converter;

determine a noise value, preferably an AC_RMS noise value, from output samples of the A/D converter;

b) select one of the possible values for E(n) that produces the least noise value;

perform steps a) and b) for a plurality of coefficients E to produce a final set of coefficients E, wherein correction values derived from the final set of coefficients preferably have the minimum AC_RMS noise; and configure the digital correction unit with correction values based on the final set of coefficients E;

wherein the digital correction unit is useable in correcting for linearity errors in the A/D converter.

Figure 12:
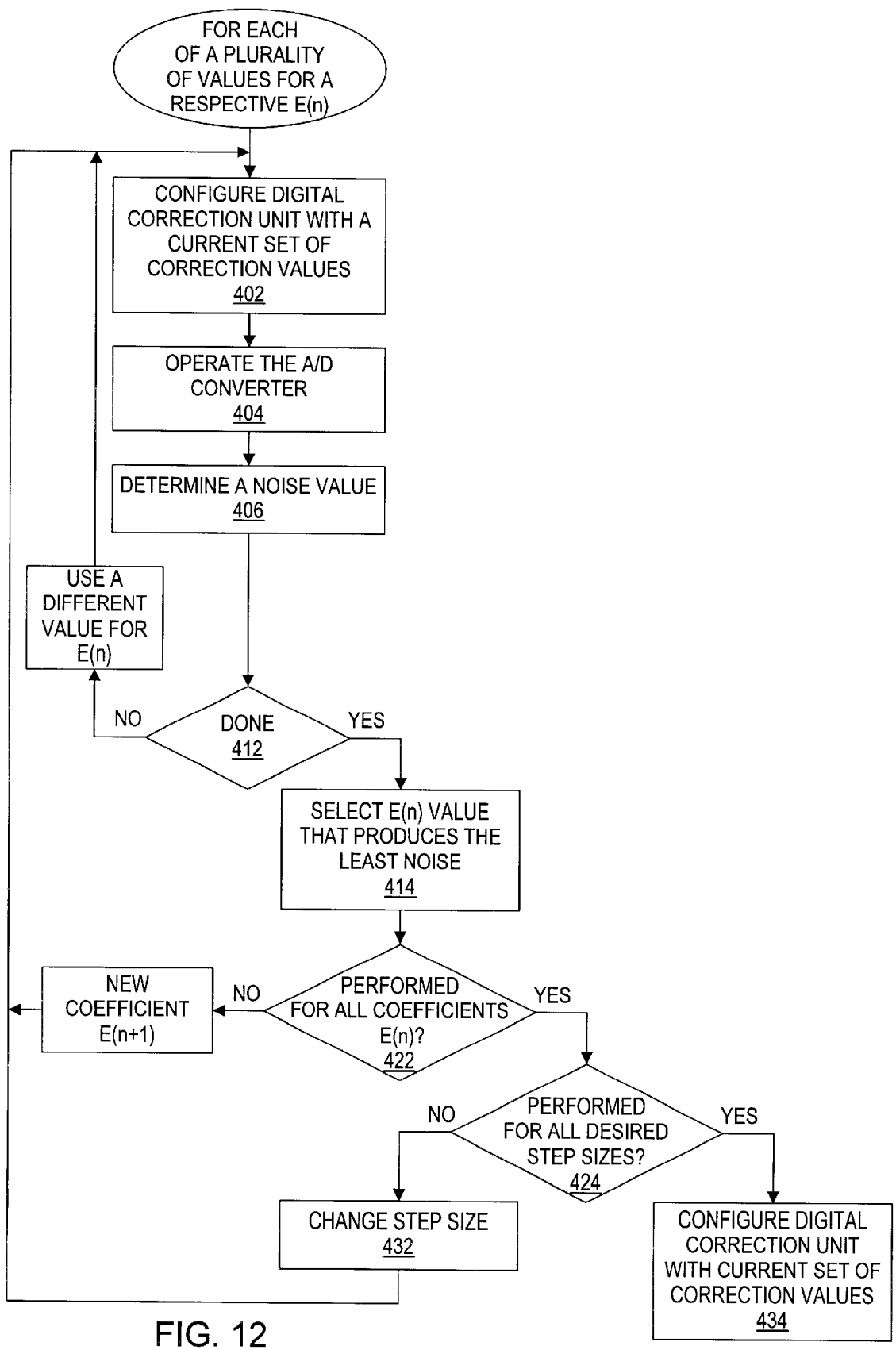
FIG. 12 is a detailed flowchart diagram illustrating generation of correction values according to one embodiment of the present invention.

FIG. 12—Flowchart of the Method

The method above is described in more detail with respect to FIG. 12.

First the method performs steps 402–406 for each of a plurality of possible values of a coefficient E(n).

In step 402, the method configures the digital correction unit 224 with a current set of correction values, wherein the current set of correction values includes a value based on one of the possible "test" values of E(n). Thus the processor 222 may operate to configure the digital correction unit 224 with a current set of correction values. The correction values are derived from error values E(n) from E(0) to E(M−1), wherein each coefficient value E(n) is associated with a current generator within the internal D/A converter 210. For the current E coefficient E(n) being evaluated, this E(n) coefficient is assigned a possible "test" value, and the digital correction unit 224 is configured with correction values that are based on the other E values and this possible "test" value for E(n). If this is the first calibration to ever be performed on the ADC, the coefficients are preferably reset before assigning the value to E(n). Otherwise, the values determined on the previous calibration are preferably used, since they are probably a better guess and may require less adjustment.

In step 402 the processor 222 determines at least one new correction value from the current "test" value for E(n), or determines at least one new correction value from the selected E(n) value in step 414, wherein the at least one new correction value is included in the current set of correction values used in step 402. As noted above, the correction unit 224 receives sample values and switching pattern information from the DS modulator. From this information the correction unit 224 calculates which generators were active.

In one embodiment, for the active generators the corresponding E(n) are selected and summed together in order to calculate the corrected value.

Thus, generation of the correction values utilizes knowledge of the sample value and barrel shifter state for each sample. In the preferred embodiment, the correction value is simply the sum of E(n) for the active current generators. The output value of the digital correction block is the sample value plus the correction value. In some embodiments, e.g., for some types of A/D converters, a sum of selected error coefficients E(n) produces the digital correction value, as noted above.

In step 404 the A/D converter operates as configured in FIG. 9, wherein the A/D converter operates uses dynamic element matching in the internal D/A converter. The input of the A/D converter may be shorted to ground or to another constant value, and the A/D converter operates. The digital correction unit 224 operates in the A/D converter to correct the output digital values based on the current set of correction values configured in the digital correction block 224 in step 402.

In step 406 the processor 222 may determine a noise value from output samples of the A/D converter. In step 406, the processor 222 may perform an AC_RMS calculation on a set of L samples from the output of the decimator. In one embodiment, the AC_RMS is calculated as: square root (square(RMS)−square(Mean)). This effectively computes the AC noise, not including the DC component of the noise.

Steps 402–406 are repeated each of a plurality of possible values of the coefficient E(n) being evaluated. For example, steps 402–406 may be repeated for three values of E(n), these being: E(n)−step_size, E(n), and E(n)+step_size. In another embodiment, steps 402–406 may be repeated for a greater number of possible values of E(n). Thus the processor 222 repeats steps 402–406 for different possible "test" values of E(n) to determine which produces the least AC noise. Each time steps 402–406 are repeated, new correction values are computed from the current E values, including the current "test" value for E(n) that is being evaluated.

After steps 402–406 have been repeated for each of the plurality of test values for the respective coefficient E(n), then in step 414 the processor 222 selects one of the possible values for E(n) that produces the least noise value. In other words, in step 414 the processor 222 selects the E(n) value that produced the lowest AC_RMS value. Thus, repeating steps 402–406 for different test values of E(n) is akin to "turning a knob" of the error E value to determine the E value that produces the least noise.

The above sequence comprising performing steps 402–406 for each of a plurality of test values for a coefficient E(n) followed by selecting the E(n) value that produces the least noise may be performed for a subset or all of the coefficients E. In one embodiment, the above sequence is performed for all coefficients E(n) for n=0 to M−1. Thus each error coefficient E(n) is evaluated for n=0 to M−1. Once the above method as been performed for the desired subset of coefficients E(n), or for all coefficients E(n), as determined in step 422, then the method may optionally be repeated using different step_size values. Thus, in one embodiment, the step size may be changed in step 432, and the above method comprising steps 402–422 may be repeated for a desired subset or all of the coefficients.

After steps 402–424 have been performed to select a set of E values (the final set of coefficient values E) in step 434 the processor 222 may configure the digital correction unit with correction values based on the final set of coefficients E.

After each stage of configuring the digital correction unit 224 in step 402, the digital correction unit 224 is useable in correcting for linearity errors in the A/D converter. After the digital correction unit 224 is configured with the final set of correction values in step 434, the digital correction unit 224 is configured to perform a more optimal linearity error correction.

One embodiment of the method of FIG. 12 is set out below.

1) The trimming applies to M coefficients. Each coefficient is associated to a current generator within the ADC. We will denote these coefficients E(0), E(1), ..., E(n), ... E(M−1). If this is the first calibration to be performed on the ADC ever, the coefficients should be reset. Otherwise it is better to stay with the values found on the previous calibration, since they probably are a better initial guess and may require less adjustment.
2) Assign an initial value to the variable step_size: step_size=initial_value.
3) Assign the value 0 to the variable n: n=0
4) Execute AC_RMS_test for the three values of E(n): E(n)-step_size, E(n)=E(n) and E(n)=E(n)+step_size. Select the value for E(n) that gives the least AC_RMS value. (see below for a description of AC_RMS_test).
5) n=n+1
6) Repeat step 4) until n=M.
7) Repeat step 3) if any of the coefficients changed during step 3) to 6).
8) Step_size=Step_size/2
9) Repeat step 3 if Step_size>minimum_step_size.
10) Configure the linearization with the current set of M values for E AC_RMS_test:
1) Configure the linearization block (as shown in FIG. 8.14 from [1]) with the current set of M values for E.
2) Perform the AC_RMS calculation on a set of L samples from the output of the decimator. The AC_RMS can be calculated as squareroot(square(RMS)−square(MEAN)).

Figure 13:
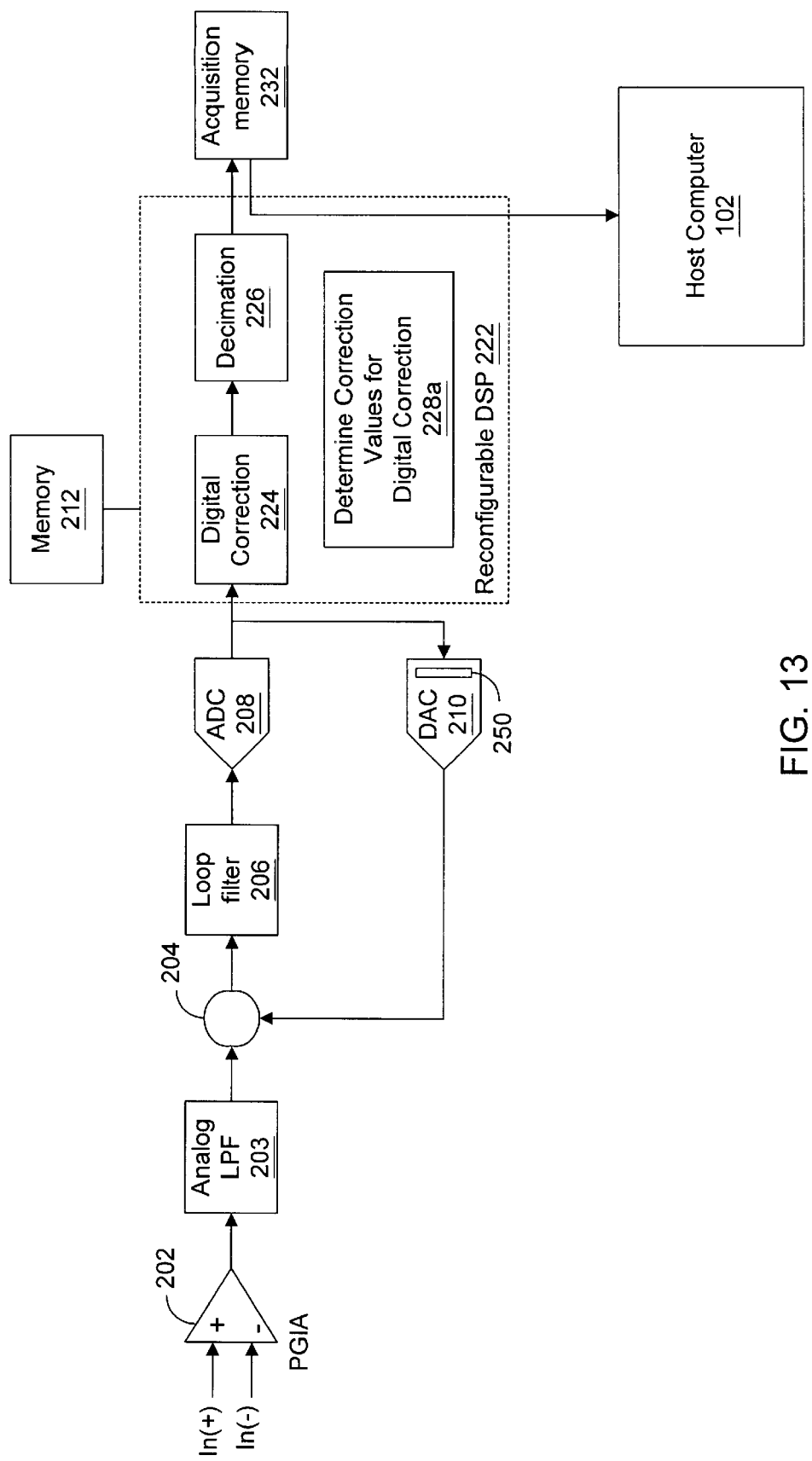
FIG. 13 is a block diagram illustrating a multi-bit A/D converter employing a second embodiment of the present invention, wherein self calibration is performed in the background during A/D conversion of input signals.

FIG. 13—Performing Self-Calibration in the Background

FIG. 13 illustrates an alternate embodiment of the present invention. In the A/D converter shown in FIG. 13, the A/D converter can implement or perform self-calibration in the background while performing A/D conversion of an input signal at the same time. The A/D converter in FIG. 13 is similar to the A/D converter in FIG. 9, except that the A/D converter in FIG. 13 includes an analog low-pass filter 203 coupled before the summing junction 204. Also, the processor 222 implements a slightly different method for performing calibration, represented by block 228A and as shown in FIG. 14.

Figure 14:
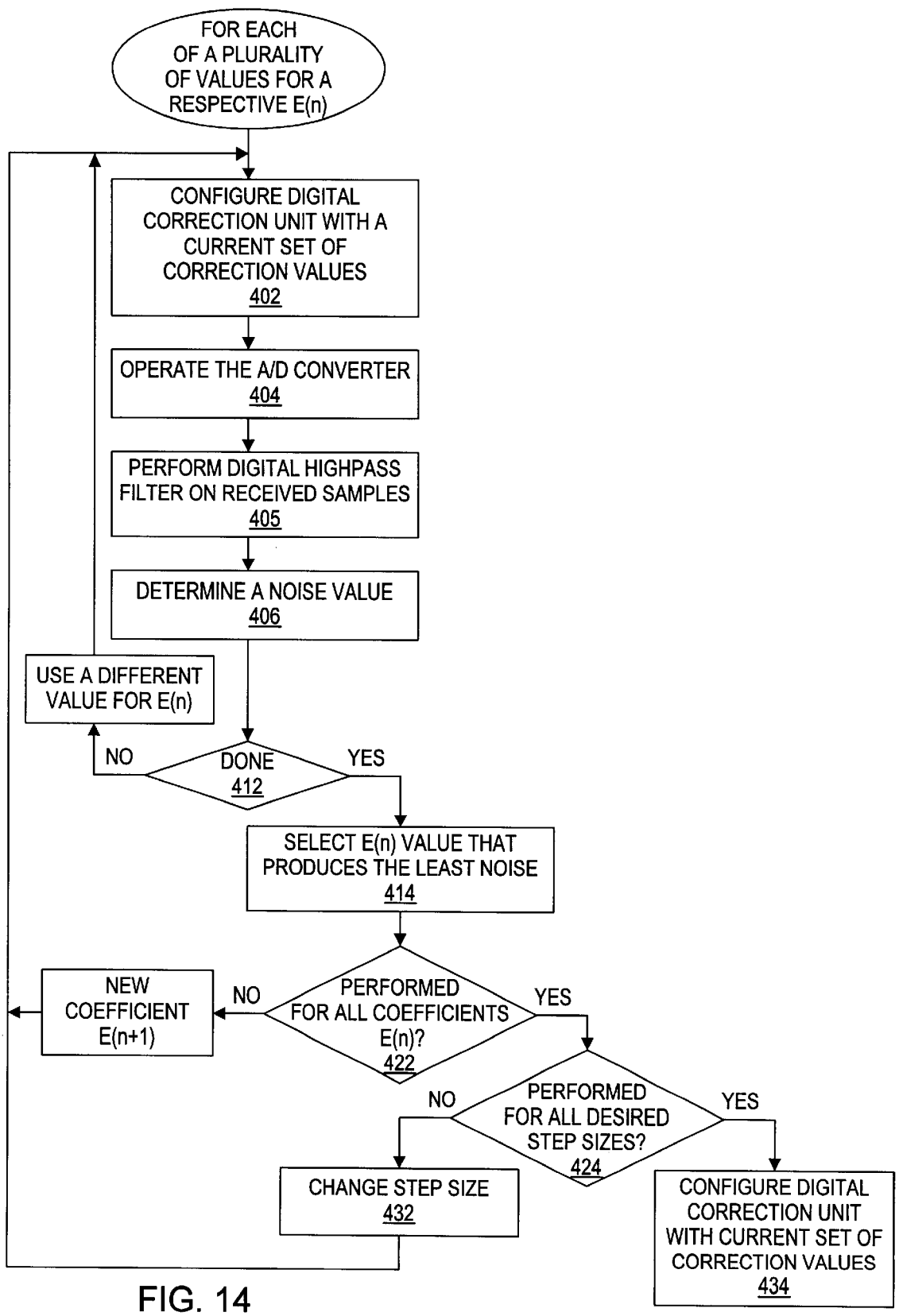
FIG. 14 is a detailed flowchart diagram illustrating calibration (generation of correction values) performed during A/D conversion of input signals according to one embodiment of the present invention.

As shown in FIG. 14, the calibration method is similar to the method described with respect to FIG. 12, except as follows. In step 404, the A/D converter may operate by receiving a real input signal, e.g., an analog input signal of interest where A/D conversion is desired to be performed. Thus the calibration can be performed while performing A/D conversion on actual input signals of interest. Also, an additional step of performing a digital high-pass filter function on the received samples is performed in step 405 after operating the A/D converter in step 404 and prior to determining the noise value in step 406. The digital high-pass filter is performed on the received samples to remove the effects of the digital conversion of the input analog signal from the noise value computed in step 406. After the digital high-pass filter is performed on the received samples in step 405, a noise value is determined in step 406 as described above. The remainder of the method of FIG. 14 preferably operates as shown in FIG. 14 and as described above with respect to FIG. 12

Thus, the A/D converter shown in FIG. 13 and the method shown in FIG. 14 enable the A/D converter to receive and perform A/D conversion on analog input signals of interest, while also performing calibration in the background during these conversions of actual input signals. The calibration also does not effect the operation of the A/D conversion on the input signals. Thus, the A/D converter can perform both analog to digital conversion on received input signals and calibration at substantially the same time.

Dynamic Re-calibration

The current generators contained within the internal D/A converter 210 may vary with time and temperature. Accordingly, the linearity error associated thereto may likewise vary over time and temperature. Thus, the L/E circuit 224 may be recalibrated over time and use, in order to account for changing linearity errors. In other words, the L/E circuit or digital correction 224 may be dynamically recalibrated during use according to the methods described above. To recalibrate, the above methods described in either FIG. 12 or FIG. 14 is performed, and the processor 222 generates a new set of correction values c(m) and reconfigures the LIE correction circuit 224 in accordance thereto. In this manner, the resolution of the A/D converter can be maximized throughout its use.

Numerous variations and modifications will become apparent to those skilled in the art once the above disclosure is fully appreciated. It is intended that the following claims be interpreted to embrace all such variations and modifications.

What is claimed is:

1. A method for configuring a digital correction unit for an analog to digital (A/D) converter, wherein the A/D converter includes an internal D/A converter, wherein the internal D/A converter includes a plurality M of current generators, wherein one or more of the current generators produces linearity errors in the A/D converter, wherein the digital correction unit is configurable with a set of correction values, wherein the correction values are determined from coefficients E(n) for n=0 to M−1, wherein each coefficient E(n) is associated with one of the current generators in the internal D/A converter, the method comprising:

a) for each of a plurality of possible values of a coefficient E(n):
configuring the digital correction unit with a current set of correction values, wherein the current set of correction values includes a value based on one of said possible values of E(n);
operating the A/D converter, wherein said operating uses dynamic element matching in the internal D/A converter; and
determining a noise value from output samples of the A/D converter; and b) selecting one of said possible values for E(n) that produces the least noise value;

performing steps a) and b) for a plurality of coefficients E to produce a final set of coefficients E; and configuring the digital correction unit with correction values based on the final set of coefficients E;

wherein the digital correction unit is useable in correcting for linearity errors in the A/D converter.

2. The method of claim 1, further comprising shorting the input to the A/D converter during said operating the A/D converter.

3. The method of claim 2, wherein said operating the A/ID converter includes adjusting connections to a plurality of the current generators in the internal D/A converter, wherein said adjusting connections causes different ones of the current generators to be stimulated by an input to the A/D converter.

4. The method of claim 3, wherein said adjusting connections comprises adjusting connections to a plurality of the current generators a plurality of times according to a plurality of different switching patterns, thereby causing different ones of the current generators to be stimulated by the input to the A/D converter.

5. The method of claim 1, wherein said operating the A/D converter includes adjusting connections to a plurality of the current generators in the internal D/A converter, wherein said adjusting connections causes different ones of the current generators to be stimulated by an input to the A/D converter.

6. The method of claim 5, wherein said adjusting connections comprises adjusting connections to a plurality of the current generators a plurality of times according to a plurality of different switching patterns, thereby causing different ones of the current generators to be stimulated by the input to the A/D converter.

7. The method of claim 6, wherein the internal D/A converter includes a switching element, wherein the switching element operates to perform said adjusting connections to cause bits of an input digital code to be provided to different ones of the current generators in the internal D/A converter.

8. The method of claim 1, wherein said operating the A/D converter using dynamic element matching comprises using different current generator elements in the internal D/A converter to represent a digital code at different times.

9. The method of claim 1, wherein steps a) and b) are performed in real time during operation of the A/D converter.

10. The method of claim 1, wherein the A/D converter includes a processor which performs decimation functions;
wherein the processor in the A/D converter performs said configuring the digital correction unit, said operating the A/D converter, and said determining a noise value from output samples of the A/D converter.

11. The method of claim 1, wherein the method produces a set of correction values which minimize AC noise in the A/D converter.

12. The method of claim 1, wherein said determining a noise value from output samples of the A/D converter comprises performing an AC_RMS calculation on a set of output samples of the A/D converter.

13. The method of claim 1, wherein the plurality of possible values of coefficient E(n) comprise a current value E(n), E(n)−step size, and E(n)+step size, wherein step size is a constant value.

14. The method of claim 1, wherein said performing comprises performing steps a) and b) for all coefficients E(n) for n=0 to M−1.

15. The method of claim 1, further comprising:
repeating said performing steps a) and b) for a plurality of coefficients E one or more times if any of said coefficients E changed in said performing.

16. The method of claim 1,
wherein said configuring the digital correction unit with a current set of correction values includes determining at least one new correction value from the one of said possible values of E(n).

17. The method of claim 1, wherein the A/D converter comprises a sigma delta analog to digital converter.

18. The method of claim 1, further comprising:
providing an input signal to the A/D converter; and
the digital correction unit operating to correct for linearity errors in an output of the A/D converter.

19. A method for configuring a digital correction unit for an analog to digital (A/D) converter, wherein the A/D converter includes an internal D/A converter, wherein the internal D/A converter includes a plurality M of current generators, wherein one or more of the current generators produces linearity errors in the A/D converter,
wherein the digital correction unit is configurable with a set of correction values, wherein the correction values are determined from (or comprise) coefficients E(n) for n=0 to M−1, wherein each coefficient E(n) is associated with one of the current generators in the internal D/A converter, the method comprising:
a) for each of a plurality of coefficients E(n), for n=0 to M−1:
a1) for each of a plurality of possible values of coefficient E(n):
configuring the digital correction unit with a current set of correction values, wherein the current set of correction values includes one of said possible values of E(n);
operating the A/D converter, wherein said operating uses dynamic element matching;
determining a noise value from output samples of the A/D converter;
a2) selecting one of said possible values for E(n) that produces the least noise value, wherein the selected value for E(n) is included in the current set of correction values;
wherein steps a1) and a2) performed for the plurality of coefficients E produces a final set of coefficients E; and
b) configuring the digital correction unit with the final set of coefficients E.

20. An analog to digital (A/D) converter system, comprising:
an input for receiving an input signal;
an internal A/D converter coupled to the input;
an internal D/A converter coupled to the internal A/D converter, wherein the internal D/A converter includes a plurality M of current generators, wherein one or more of the current generators produces linearity errors in the A/D converter;
a digital correction unit, wherein the digital correction unit is configurable with a set of correction values, wherein the correction values are determined from coefficients E(n) for n=0 to M−1, wherein each coefficient E(n) is associated with one of the current generators in the internal D/A converter;
a processor coupled to the digital correction unit and comprised in the A/D converter, wherein the processor is operable to:
a) for each of a plurality of possible values of a coefficient E(n):
configure the digital correction unit with a current set of correction values, wherein the current set of correction values includes a value based on one of said possible values of E(n);
wherein the A/D converter operates using dynamic element matching in the internal D/A converter after being configured; and determine a noise value from output samples of the A/D converter;

b) select one of said possible values for E(n) that produces the least noise value;

perform a) and b) for a plurality of coefficients E to produce a final set of coefficients E; and configure the digital correction unit with correction values based on the final set of coefficients E;

wherein the digital correction unit is useable in correcting for linearity errors in the A/D converter.

21. The A/D converter system of claim 20, wherein said operating the A/D converter using dynamic element matching comprises using different current generator elements in the internal D/A converter to represent a digital code at different times.

22. The A/D converter system of claim 20, wherein the processor performs a) and b) in real time during operation of the A/D converter.

* * * * *